(12) United States Patent
Kijima

(10) Patent No.: US 11,758,817 B2
(45) Date of Patent: Sep. 12, 2023

(54) FILM STRUCTURE AND METHOD FOR MANUFACTURING THE SAME

(71) Applicant: ADVANCED MATERIAL TECHNOLOGIES INC., Chiba (JP)

(72) Inventor: Takeshi Kijima, Yamaguchi (JP)

(73) Assignee: KRYSTAL INC., Yamaguchi (JP)

( * ) Notice: Subject to any disclaimer, the term of this patent is extended or adjusted under 35 U.S.C. 154(b) by 1359 days.

(21) Appl. No.: 16/096,077

(22) PCT Filed: May 31, 2017

(86) PCT No.: PCT/JP2017/020209
§ 371 (c)(1),
(2) Date: Oct. 24, 2018

(87) PCT Pub. No.: WO2017/221649
PCT Pub. Date: Dec. 28, 2017

(65) Prior Publication Data
US 2019/0123257 A1     Apr. 25, 2019

(30) Foreign Application Priority Data
Jun. 21, 2016 (JP) .................................. 2016-122342

(51) Int. Cl.
*H01L 41/083* (2006.01)
*H10N 30/50* (2023.01)
(Continued)

(52) U.S. Cl.
CPC ........... *H10N 30/508* (2023.02); *C23C 14/08* (2013.01); *C23C 14/083* (2013.01);
(Continued)

(58) Field of Classification Search
CPC ...................... H01L 41/0838; H01L 41/1876
See application file for complete search history.

(56) References Cited

U.S. PATENT DOCUMENTS

2006/0214540 A1  9/2006 Yuu
2008/0074471 A1* 3/2008 Sakashita ........... H10N 30/8561
                                                        347/68
(Continued)

FOREIGN PATENT DOCUMENTS

JP  2006-269916   10/2006
JP  2006-332368   12/2006
(Continued)

OTHER PUBLICATIONS

English Translation of JP 2006332368, Hideki (Year: 2006).*
(Continued)

*Primary Examiner* — Bryan P Gordon
(74) *Attorney, Agent, or Firm* — Wenderoth, Lind & Ponack, L.L.P.

(57) ABSTRACT

A film structure (10) includes a substrate (11), a piezoelectric film (14) formed on the substrate (11) and containing first composite oxide represented by a composition formula $Pb(Zr_{1-x}Ti_x)O_3$, and a piezoelectric film (15) formed on the piezoelectric film (14) and containing second composite oxide represented by a composition formula $Pb(Zr_{1-y}Ti_y)O_3$. In the composition formulae, x satisfies $0.10<x\leq0.20$, and y satisfies $0.35\leq y\leq0.55$. The piezoelectric film (14) has tensile stress, and the piezoelectric film (15) has compressive stress.

14 Claims, 24 Drawing Sheets

(51) Int. Cl.
*C23C 14/35* (2006.01)
*C23C 14/30* (2006.01)
*C23C 14/08* (2006.01)
*C30B 29/32* (2006.01)
*C30B 1/02* (2006.01)
*C30B 29/68* (2006.01)
*C30B 23/02* (2006.01)
*H10N 30/05* (2023.01)
*H10N 30/06* (2023.01)
*H10N 30/076* (2023.01)
*H10N 30/078* (2023.01)
*H10N 30/87* (2023.01)
*H10N 30/00* (2023.01)
*H10N 30/853* (2023.01)
*C23C 14/34* (2006.01)
*C23C 14/58* (2006.01)
*C30B 29/22* (2006.01)
*C30B 33/02* (2006.01)

(52) U.S. Cl.
CPC ............ *C23C 14/088* (2013.01); *C23C 14/30* (2013.01); *C23C 14/34* (2013.01); *C23C 14/35* (2013.01); *C23C 14/5806* (2013.01); *C30B 1/02* (2013.01); *C30B 23/02* (2013.01); *C30B 23/025* (2013.01); *C30B 29/22* (2013.01); *C30B 29/32* (2013.01); *C30B 29/68* (2013.01); *C30B 33/02* (2013.01); *H10N 30/05* (2023.02); *H10N 30/06* (2023.02); *H10N 30/076* (2023.02); *H10N 30/078* (2023.02); *H10N 30/1051* (2023.02); *H10N 30/8554* (2023.02); *H10N 30/877* (2023.02)

(56) References Cited

U.S. PATENT DOCUMENTS

| | | | | |
|---|---|---|---|---|
| 2010/0148637 | A1* | 6/2010 | Satou | H03H 3/02 310/367 |
| 2013/0328451 | A1* | 12/2013 | Kubo | H10N 30/8554 174/268 |
| 2014/0132676 | A1* | 5/2014 | Yazaki | H10N 30/2047 347/71 |
| 2015/0232979 | A1 | 8/2015 | Kijima et al. | |
| 2015/0349240 | A1* | 12/2015 | Mizukami | H10N 30/045 427/535 |
| 2016/0049577 | A1* | 2/2016 | Kijima | C30B 28/12 204/192.15 |
| 2017/0158571 | A1 | 6/2017 | Kijima | |

FOREIGN PATENT DOCUMENTS

| | | |
|---|---|---|
| JP | 2007-335779 | 12/2007 |
| JP | 2008-42069 | 2/2008 |
| JP | 2015-154014 | 8/2015 |
| JP | 2016-42505 | 3/2016 |
| WO | 2016/009698 | 1/2016 |

OTHER PUBLICATIONS

International Search Report dated Aug. 1, 2017 in International Application No. PCT/JP2017/020209.

First Office Action dated Sep. 9, 2022 in corresponding Chinese Patent Application No. 201780033448.5, with English language translation.

* cited by examiner

FILM STRUCTURE AND METHOD FOR MANUFACTURING THE SAME

TECHNICAL FIELD

The present invention relates to a film structure and a method for manufacturing the same.

BACKGROUND ART

A known film structure including a substrate and a piezoelectric film formed on the substrate includes a piezoelectric film containing lead zirconate titanate (PZT), which is $PbZr_xTi_{1-x}O_3$ ($0<x<1$), formed on the substrate. Such a film structure is processed to form a piezoelectric element. A known piezoelectric film containing PZT includes a first piezoelectric film formed on the substrate, and a second piezoelectric film formed on the first piezoelectric film.

JP 2006-332368 A (Patent Literature 1) discloses a method for manufacturing a piezoelectric thin film element. In this method, a highly oriented first piezoelectric thin film is formed as a base film on a first electrode thin film by a chemical solution method, and then a highly oriented second piezoelectric thin film is formed on the first piezoelectric thin film by a sputtering method.

JP 2015-154014 A (Patent Literature 2) discloses a method for manufacturing a ferroelectric film. In this method, a noncrystalline precursor film is formed by a method for applying a solution, a ferroelectric coated sintered crystal film is formed by crystallizing the noncrystalline precursor film through oxidization, and a ferroelectric crystal film is formed on the ferroelectric coated sintered crystal film by a sputtering method.

WO 2016/009698 A (Patent Literature 3) discloses a ferroelectric ceramic including a $Pb(Zr_{1-A}Ti_A)O_3$ film, and a $Pb(Zr_{1-x}Ti_x)O_3$ film formed on the $Pb(Zr_{1-A}Ti_A)O_3$ film, where A satisfies $0 \leq A \leq 0.1$, and x satisfies $0.1 < x < 1$.

CITATION LIST

Patent Literature

Patent Literature 1: JP 2006-332368 A
Patent Literature 2: JP 2015-154014 A
Patent Literature 3: WO 2016/009698 A

SUMMARY OF INVENTION

Technical Problem

When a piezoelectric film included in a film structure includes a first piezoelectric film formed on a substrate and a second piezoelectric film formed on the first piezoelectric film, and the first piezoelectric film and the second piezoelectric film have tensile stress, the substrate is easily warped to have a downwardly convex shape. For this reason, for example, shape precision is lowered when a film structure is processed by using a photolithography technique, and characteristics of a piezoelectric element formed by processing the film structure are degraded.

When both the first piezoelectric film and the second piezoelectric film have compressive stress, the substrate is easily warped to have an upwardly convex shape. For this reason, for example, shape precision is lowered when a film structure is processed by using a photolithography technique, and characteristics of a piezoelectric element formed by processing the film structure are degraded.

The present invention has been made to solve the problems of the prior art as described above, and it is an object of the present invention to provide a film structure including two piezoelectric films laminated on a substrate, and capable of reducing a warp amount by which the substrate is warped.

Solution to Problem

Outline of representative ones of the inventions disclosed in the present application will be briefly described as follows.

A film structure as one aspect of the present invention includes a substrate, a first film formed on the substrate and containing first composite oxide represented by a composition formula (1) below, and a second film formed on the first film and containing second composite oxide represented by a composition formula (2) below.

$$Pb(Zr_{1-x}Ti_x)O_3 \qquad (1)$$

$$Pb(Zr_{1-y}Ti_y)O_3 \qquad (2)$$

In the above composition formulae, x satisfies $0.10<x\leq0.20$, and y satisfies $0.35\leq y\leq0.55$. The first film has tensile stress, and the second film has compressive stress.

In another aspect, the first film may include a plurality of layers laminated on each other, and the second film may include a plurality of crystal grains integrally formed from a lower surface to an upper surface of the second film.

In another aspect, each of the plurality of crystal grains may have spontaneous polarization, the spontaneous polarization may include a polarization component parallel to a thickness direction of the second film, and the polarization components included in the spontaneous polarization of each of the plurality of crystal grains may be oriented in an identical direction.

In another aspect, the substrate may be a silicon substrate.

In another aspect, the film structure may include a third film formed on a silicon substrate, and a conductive film formed on the third film. The silicon substrate may have a main surface made of a (100) plane, the third film may contain zirconium oxide having a cubic crystal structure and being (100) oriented, the conductive film may contain platinum having a cubic crystal structure and being (100) oriented, and the first composite oxide may have a rhombohedral crystal structure and may be (100) oriented.

In another aspect, the second composite oxide may have a rhombohedral crystal structure and may be (100) oriented.

In another aspect, the second composite oxide may have a tetragonal crystal structure and may be (001) oriented.

A method for manufacturing a film structure as one aspect of the present invention includes the steps of: (a) preparing a substrate; (b) forming a first film containing first composite oxide represented by a composition formula (1) below on the substrate; and (c) forming a second film containing second composite oxide represented by a composition formula (2) below on the first film.

$$Pb(Zr_{1-x}Ti_x)O_3 \qquad (1)$$

$$Pb(Zr_{1-y}Ti_y)O_3 \qquad (2)$$

In the above composite formulae, x satisfies $0.10<x\leq0.20$, and y satisfies $0.35\leq y\leq0.55$. The step (b) includes the steps of: (b1) forming a third film containing a first precursor of the first composite oxide by coating the substrate with a first solution containing lead, zirconium, and titanium; and (b2) forming the first film by heat-treating the third film. In the step (c), the second film is formed by a sputtering method.

In another aspect, the first film may have tensile stress, and the second film may have compressive stress.

In another aspect, the step (b1) may include a step (b3) of forming a fourth film containing the first precursor by coating the substrate with the first solution. In the step (b1), the step (b3) may be repeated a plurality of times to form the third film including a plurality of the fourth films laminated on each other, and in the step (c), the second film including a plurality of crystal grains integrally formed from a lower surface to an upper surface of the second film may be formed.

In another aspect, each of the plurality of crystal grains may have spontaneous polarization, the spontaneous polarization may include a polarization component parallel to a thickness direction of the second film, and the polarization components included in the spontaneous polarization of each of the plurality of crystal grains may be oriented in an identical direction.

In another aspect, in the step (a), the substrate that is a silicon substrate may be prepared.

In another aspect, the method for manufacturing a film structure may include the steps of: (d) forming a fifth film containing zirconium oxide on a silicon substrate, the zirconium oxide having a cubic crystal structure and being (100) oriented; and (e) forming a conductive film containing platinum on the fifth film, the platinum having a cubic crystal structure and being (100) oriented. In the step (b), the first film may be formed on the conductive film, the silicon substrate may have a main surface made of a (100) plane, and the first composite oxide may have a rhombohedral crystal structure and may be (100) oriented.

In another aspect, the second composite oxide may have a rhombohedral crystal structure and may be (100) oriented.

In another aspect, the second composite oxide may have a tetragonal crystal structure and may be (001) oriented.

Advantageous Effects of Invention

Application of one aspect of the present invention makes it possible to reduce a warp amount by which a substrate is warped in a film structure including two piezoelectric films laminated on the substrate.

DESCRIPTION OF EMBODIMENTS

Figure 1:
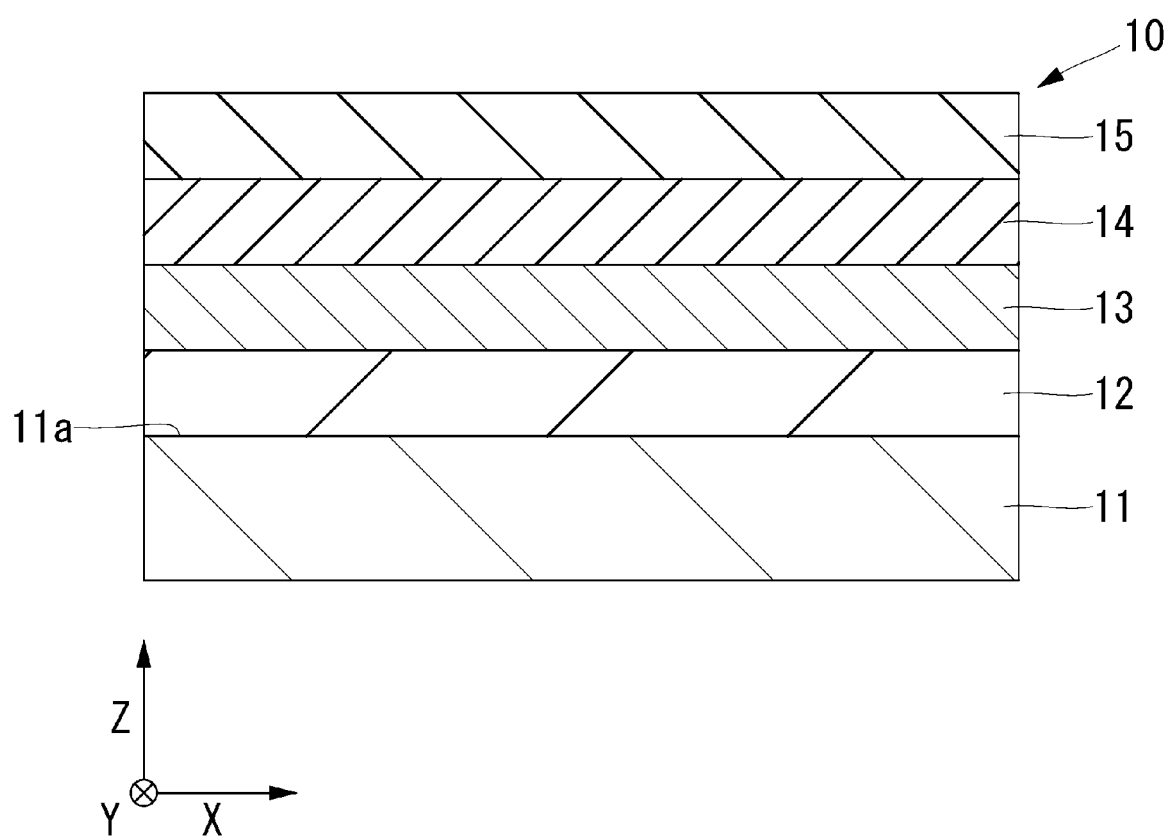
FIG. 1 is a cross-sectional view of a film structure according to a first embodiment.

Hereinafter, embodiments of the present invention will be described with reference to the drawings.

The disclosure is merely an example, and appropriate modifications that those of ordinary skill in the art will readily conceive of while keeping the gist of the invention are contained in the scope of the present invention as a matter of course. Further, in order to clarify the description, the drawings may be schematically represented in terms of the width, thickness, shape, and the like of each part as compared to the embodiment, which is, however, merely exemplary and does not limit the interpretation of the present invention.

In addition, in the present specification and each drawing, the same reference numerals are given to the same elements as those described above with reference to the preceding drawings, and detailed explanation thereof may be omitted as occasion demands.

Further, in the drawings used in the embodiments, hatching (shading) attached to distinguish structures may be omitted in accordance with the drawing in some cases.

First Embodiment

<Film Structure>

Figure 2:
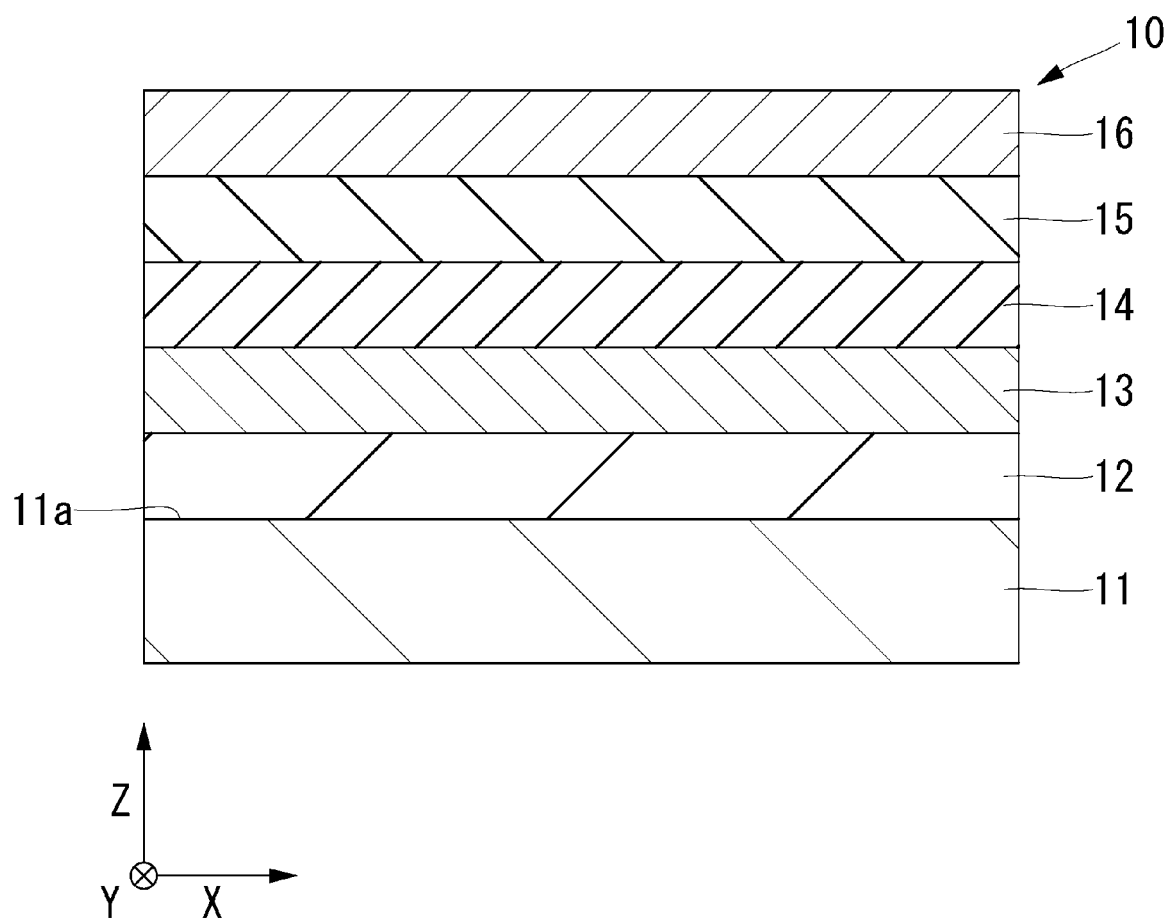
FIG. 2 is a cross-sectional view of the film structure according to the first embodiment.
Figure 3:
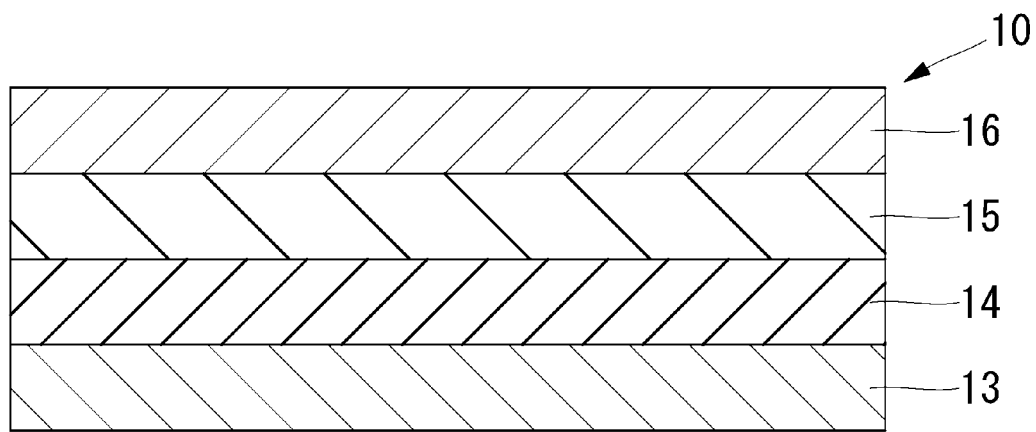
FIG. 3 is a cross-sectional view of the film structure according to the first embodiment.
Figure 3:
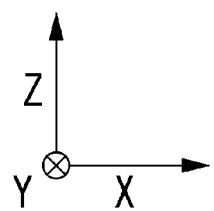
Figure 4:
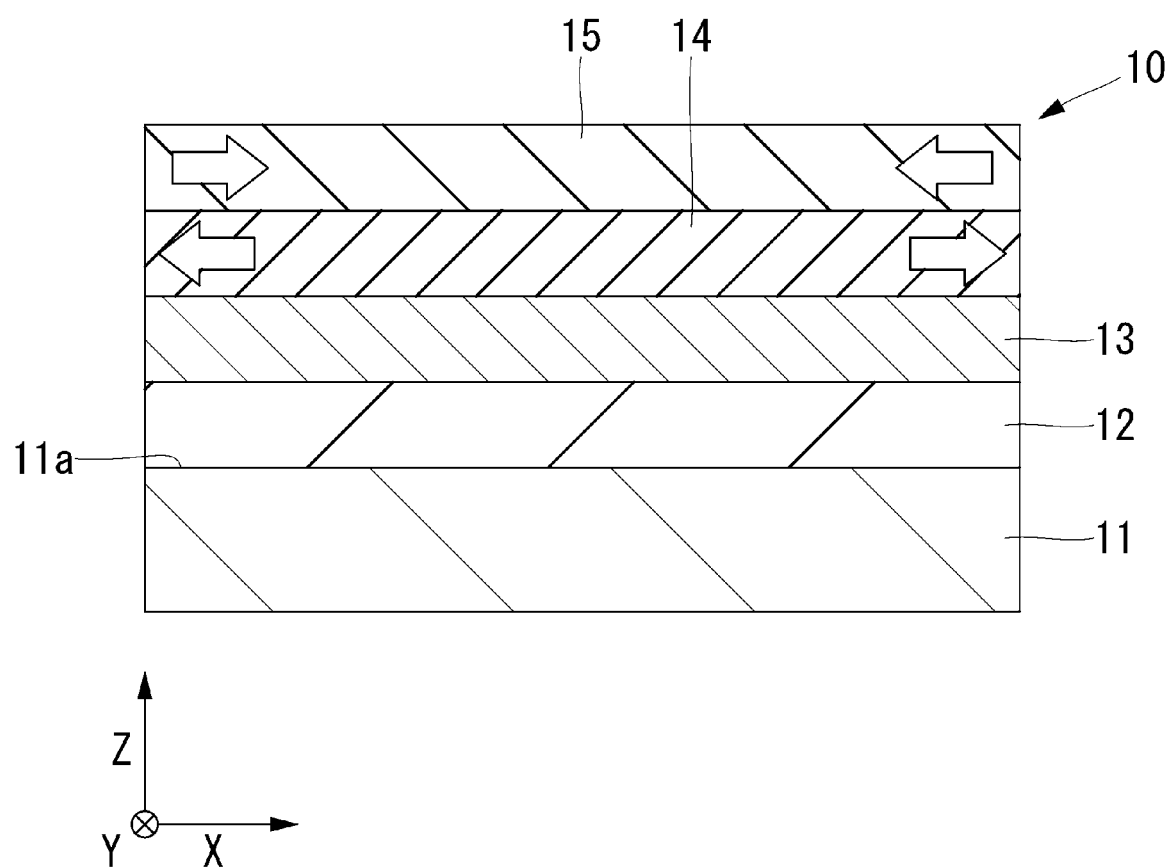
FIG. 4 is a cross-sectional view of the film structure according to the first embodiment.
Figure 5:
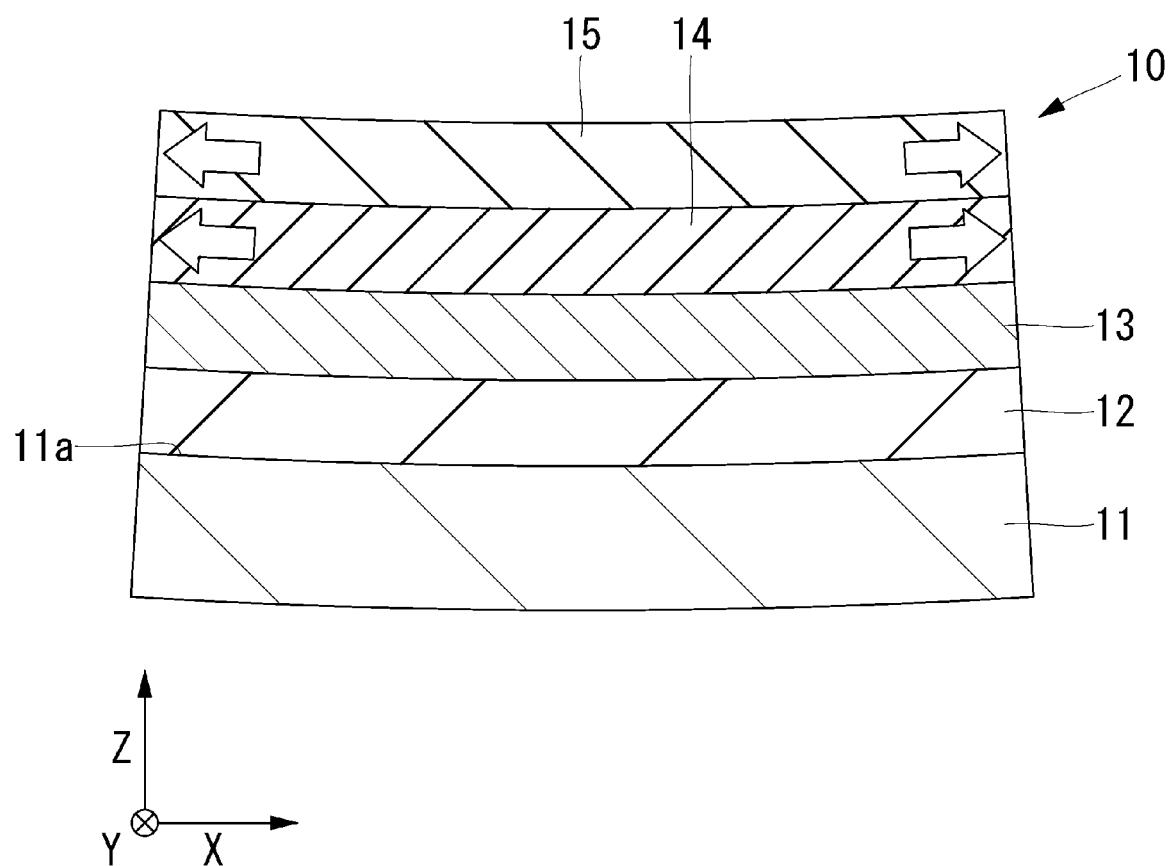
FIG. 5 is a cross-sectional view of a film structure according to Comparative Example 1.
Figure 6:
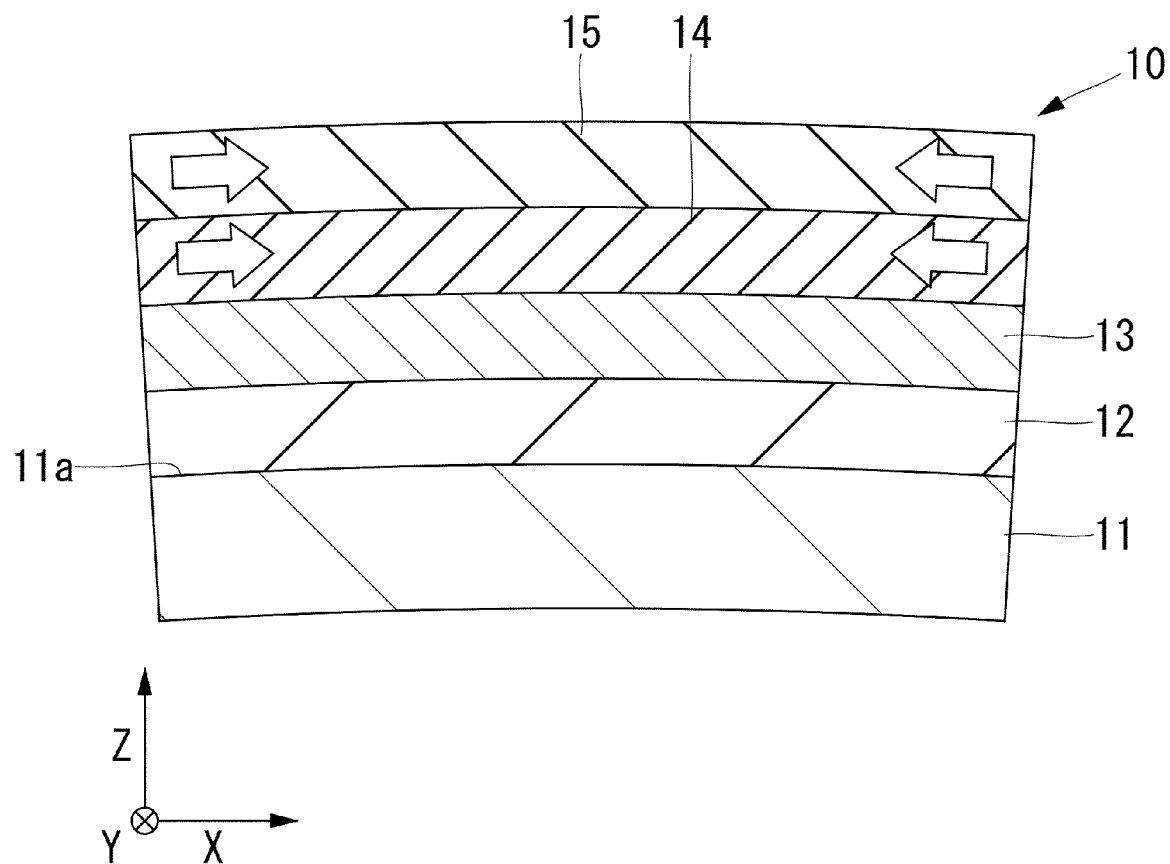
FIG. 6 is a cross-sectional view of a film structure according to Comparative Example 2.

First, a film structure according to the first embodiment as one embodiment of the present invention will be described in comparison with film structures according to Comparative Example 1 and Comparative Example 2. FIGS. 1 to 4 are cross-sectional views of the film structure according to the first embodiment. FIG. 5 is a cross-sectional view of the film structure according to Comparative Example 1. FIG. 6 is a cross-sectional view of the film structure according to Comparative Example 2. FIG. 2 is a cross-sectional view of the film structure according to the first embodiment when including a conductive film as an upper electrode. FIG. 3 is a cross-sectional view of the film structure when a substrate and an oriented film are removed from the film structure illustrated in FIG. 2. FIG. 4 schematically illustrates stress of a piezoelectric film in addition to the sectional view of the film structure illustrated in FIG. 1.

As illustrated in FIG. 1, a film structure 10 according to the first embodiment includes a substrate 11, an oriented film 12, a conductive film 13, a piezoelectric film 14, and a piezoelectric film 15. The oriented film 12 is formed on the substrate 11. The conductive film 13 is formed on the oriented film 12. The piezoelectric film 14 is formed on the conductive film 13. The piezoelectric film 15 is formed on the piezoelectric film 14.

As illustrated in FIG. 2, the film structure 10 of the first embodiment may include a conductive film 16. The conductive film 16 is formed on the piezoelectric film 15. In this configuration, the conductive film 13 is a conductive film as a lower electrode, and the conductive film 16 is a conductive film as an upper electrode. As illustrated in FIG. 3, the film structure 10 according to the first embodiment may only include the conductive film 13 as the lower electrode, the piezoelectric film 14, the piezoelectric film 15, and the conductive film 16 as the upper electrode, but not the substrate 11 (refer to FIG. 2) and the oriented film 12 (refer to FIG. 2).

Preferably, the substrate 11 is a silicon substrate made of silicon (Si) single crystal. The silicon substrate has an upper surface 11a as a main surface made of a (100) plane. The oriented film 12 contains zirconium oxide having a cubic crystal structure and being (100) oriented. The conductive film 13 contains platinum having a cubic crystal structure and being (100) oriented. Accordingly, when the piezoelectric film 14 contains composite oxide having a rhombohedral crystal structure, the piezoelectric film 14 can be (100) oriented on the substrate 11.

Here, the expression that the orientation film 12 is (100) oriented means that the (100) plane of the orientation film 12 having a cubic crystal structure is along the upper surface 11a as the main surface made of the (100) plane of the silicon substrate 11, preferably parallel to the upper surface 11a of the (100) plane of the silicon substrate 11. When the (100) plane of the oriented film 12 is parallel to the upper surface 11a of the (100) plane of the substrate 11, the (100) plane of the oriented film 12 is completely parallel to the upper surface 11a of the substrate 11, and the angle formed by the plane completely parallel to the upper surface 11a of the substrate 11 and the (100) plane of the oriented film 12 is 20° or smaller.

Alternatively, instead of the oriented film 12 made of a single layer film, an oriented film 12 made of a laminated film may be formed on the substrate 11 as the oriented film 12.

Preferably, the oriented film 12 is epitaxially grown on the substrate 11, and the conductive film 13 is epitaxially grown on the oriented film 12. Accordingly, when the piezoelectric film 14 contains composite oxide having a rhombohedral crystal structure, the piezoelectric film 14 can be epitaxially grown on the conductive film 13.

When two directions orthogonal to each other in the upper surface 11a as the main surface of the substrate 11 are defined as an X-axis direction and a Y-axis direction, and a direction orthogonal to the upper surface 11a is defined as a Z-axis direction, the expression that a certain film is epitaxially grown means that the film is oriented in each of the X-axis direction, the Y-axis direction, and the Z-axis direction.

In the first embodiment, the piezoelectric film 14 contains composite oxide represented by a composition formula below (1).

$$Pb(Zr_{1-x}Ti_x)O_3 \qquad (1)$$

In the above composition formula, x satisfies $0.10 < x \leq 0.20$. In the following description, $Pb(Zr_{1-x}Ti_x)O_3$ may be referred to as PZT in some cases.

In the case of $x \leq 0.10$, the PZT contained in the piezoelectric film 14 has an orthorhombic crystal structure, and the c axis length in $Pb(Zr_{1-x}Ti_x)O_3$ is long. Accordingly, the effect of extending the c-axis length of $Pb(Zr_{1-y}Ti_y)O_3$, which is described later by using a composition formula (2), increases. Thus, the PZT contained in the piezoelectric film 15 is likely to be (100) oriented. However, in the case of $x \leq 0.10$, since the piezoelectric film 14 has a composition far from the morphotropic phase boundary (MPB) having the highest piezoelectric constant in the vicinity of x=0.48, the piezoelectric characteristics of the piezoelectric film 14 decrease.

When $x > 0.20$, the PZT contained in the piezoelectric film 14 has a rhombohedral crystal structure, and the piezoelectric characteristics of the piezoelectric film 14 increase. However, the effect of extending the c-axis length of $Pb(Zr_{1-y}Ti_y)O_3$ decreases, and the PZT contained in the piezoelectric film 15 is less likely to be (100) oriented.

Thus, when satisfying $0.10 < x \leq 0.20$, the composite oxide (PZT) represented by the composition formula (1) and contained in the piezoelectric film 14 has a rhombohedral crystal structure and is likely to be (100) oriented on the conductive film 13.

In the first embodiment, the piezoelectric film 15 contains composite oxide represented by a composition formula below (2).

$$Pb(Zr_{1-y}Ti_y)O_3 \qquad (2)$$

In the above composition formula, y satisfies $0.35 \leq y \leq 0.55$. In the following description, $Pb(Zr_{1-y}Ti_y)O_3$ may be referred to as PZT in some cases.

In the case of $y < 0.35$, since the piezoelectric film 15 has a composition far from the MPB, the piezoelectric characteristic of the piezoelectric film 15 decreases. In the case of $y > 0.55$, since the piezoelectric film 15 has a composition far from the MPB, the piezoelectric characteristic of the piezoelectric film 15 decreases. Thus, when the composite oxide (PZT) represented by the composition formula (2) and contained in the piezoelectric film 15 satisfies $0.35 \leq y \leq 0.55$, the piezoelectric constant of the piezoelectric film 15 can be increased.

Preferably, the PZT contained in the piezoelectric film 15 has a rhombohedral crystal structure and is (100) oriented. For example, when y satisfies $0.35 \leq y \leq 0.48$, the piezoelectric film 15 has a rhombohedral crystal structure. When the PZT contained in the piezoelectric film 14 has a rhombohedral crystal structure and is (100) oriented, and y satisfies 0.35≤y≤0.48, the PZT contained in the piezoelectric film 15 has a rhombohedral crystal structure, and is likely to be epitaxially grown and (100) oriented. When PZT having a rhombohedral crystal structure is (100) oriented, the PZT has a so-called engineered domain structure, the angle between the polarization direction parallel to each direction equivalent to the [111] direction and the electric field direction parallel to the thickness direction of the piezoelectric film 15 is equal in any polarization domain, and thus piezoelectric characteristics are improved.

Alternatively, preferably, the PZT contained in the piezoelectric film 15 has a tetragonal crystal structure and is (001) oriented. For example, when y satisfies 0.48<y≤0.55, the piezoelectric film 15 has a tetragonal crystal structure. When the PZT contained in the piezoelectric film 14 has a rhombohedral crystal structure and is (100) oriented, and y satisfies 0.48<y≤0.55, the PZT contained in the piezoelectric film 15 has a tetragonal crystal structure and is likely to be epitaxially grown and (001) oriented. When the PZT having a tetragonal crystal structure is (001) oriented, the polarization direction parallel to the [001] direction and the electric field direction parallel to the thickness direction of the piezoelectric film 15 are parallel to each other, and thus piezoelectric characteristics are improved.

As illustrated in FIG. 4, in the first embodiment, the piezoelectric film 14 has tensile stress. The piezoelectric film 15 has compressive stress.

Consider a case according to Comparative Example 1 in which, as illustrated in FIG. 5, the piezoelectric film 14 has tensile stress, and the piezoelectric film 15 has tensile stress. In such a case, the film structure 10 is easily warped and has a downwardly convex shape when the upper surface 11a of the substrate 11 is the main surface. Thus, for example, shape precision in processing the film structure 10 by photolithography technology is reduced, and the characteristics of the piezoelectric element formed by processing the film structure 10 are deteriorated.

Consider a case according to Comparative Example 2 in which, as illustrated in FIG. 6, the piezoelectric film 14 has compressive stress, and the piezoelectric film 15 has compressive stress. In such a case, the film structure 10 is easily warped and has an upwardly convex shape when the upper surface 11a of the substrate 11 is the main surface. Thus, for example, shape precision in processing the film structure 10 by photolithography technology is reduced, and the characteristics of the piezoelectric element formed by processing the film structure 10 are deteriorated.

As illustrated in FIG. 4 and described above, the piezoelectric film 14 has tensile stress in the first embodiment. The piezoelectric film 15 has compressive stress. When the piezoelectric film 15 has compressive stress, the piezoelectric film 15 has a tetragonal crystal structure and is (001) oriented in some cases irrespective of whether y satisfies 0.35≤y≤0.48.

Thus, a warp amount by which the film structure 10 is warped can be reduced as compared to a case in which both the piezoelectric film 14 and the piezoelectric film 15 have tensile stress, and a warp amount by which the film structure 10 is warped can be reduced as compared to a case in which both of the piezoelectric film 14 and the piezoelectric film 15 have compressive stress. Thus, the shape accuracy can be improved, for example, when the film structure 10 is processed by photolithography technology, and the characteristics of the piezoelectric element formed by processing the film structure 10 can be improved.

It can be confirmed that the piezoelectric film 14 has tensile stress and the piezoelectric film 15 has compressive stress when, for example, upon sequential removal of the piezoelectric film 15 and the piezoelectric film 14 from the film structure 10, the substrate 11 deforms from a upwardly convex shape to a downwardly convex shape before and after the removal of the piezoelectric film 15, and the substrate 11 deforms from a downwardly convex shape to an upwardly convex shape before and after the removal of the piezoelectric film 14.

As described later with reference to FIG. 13, the piezoelectric film 14 having tensile stress can be formed by a coating method such as a sol-gel method. As described with reference to FIG. 1 when the manufacturing process of a film structure is described, the piezoelectric film 15 having compressive stress can be formed by, for example, a sputtering method.

Figure 7:
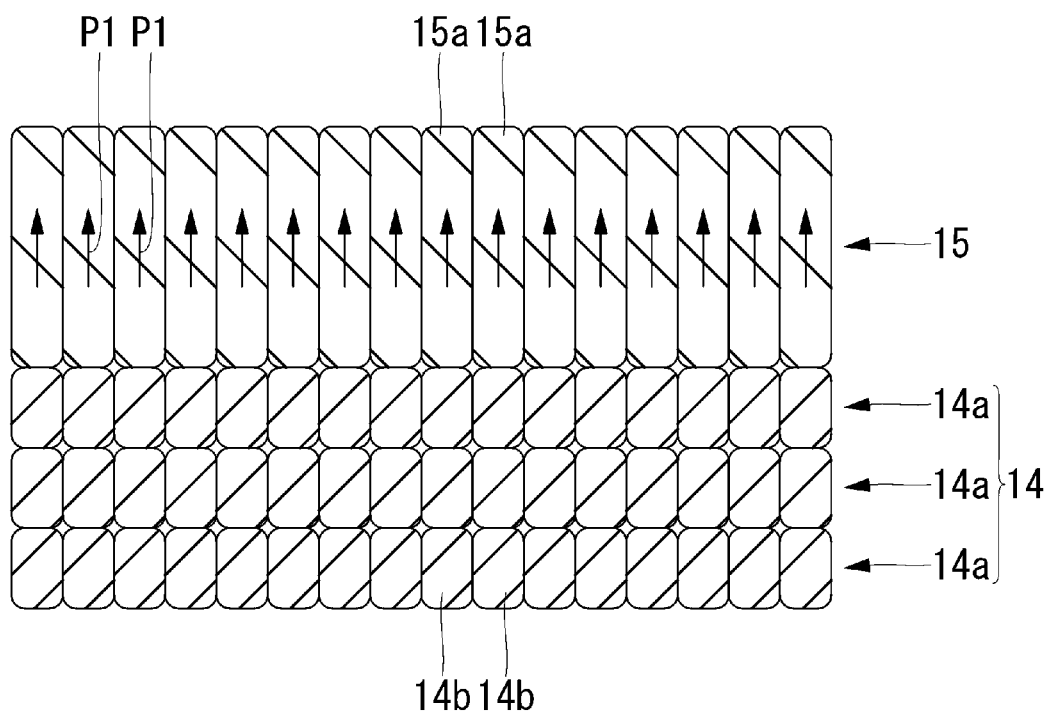
FIG. 7 is a view schematically illustrating a cross-sectional structure of two piezoelectric films included in the film structure according to the first embodiment.

FIG. 7 is a view schematically illustrating a cross-sectional structure of two piezoelectric films included in the film structure according to the first embodiment. FIG. 7 is a view schematically illustrating the piezoelectric film 14 and the piezoelectric film 15 in an observation image obtained by observing a cross section formed by cleaving the substrate 11 of the film structure 10 according to the first embodiment, in other words, a fracture surface by using a scanning electron microscope (SEM).

Figure 8:
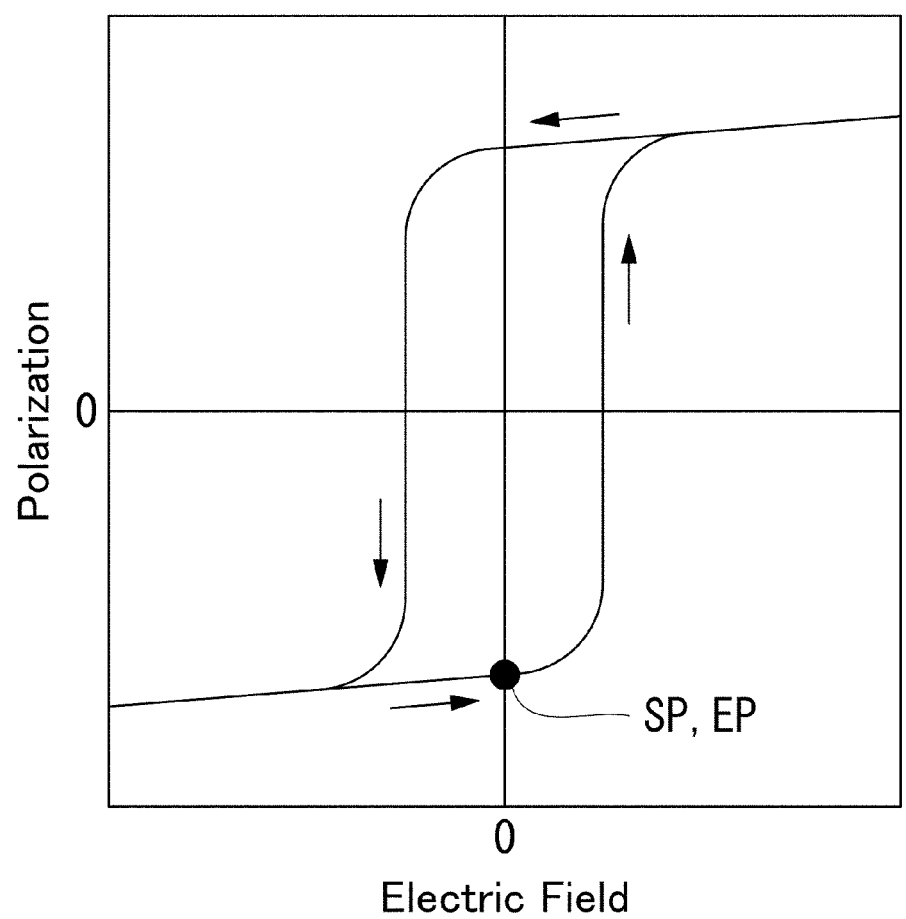
FIG. 8 is a graph schematically illustrating electric field dependency of polarization of each piezoelectric film included in the film structure according to the first embodiment.
Figure 9:
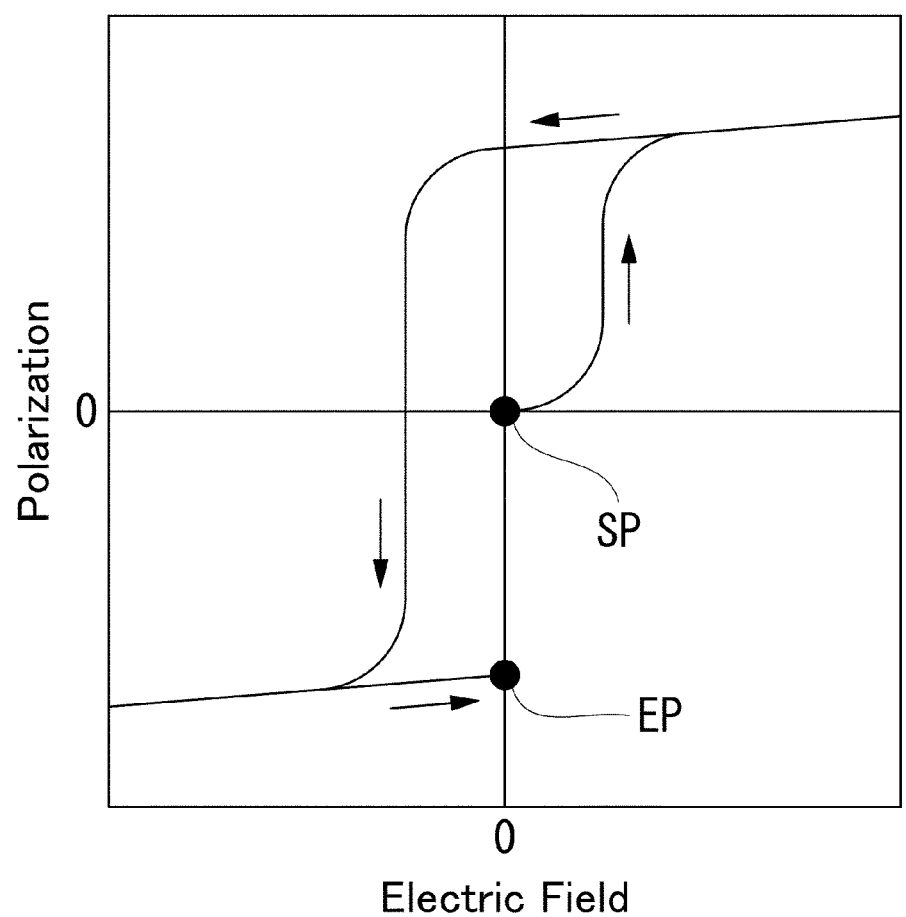
FIG. 9 is a graph schematically illustrating electric field dependency of polarization of a piezoelectric film included in the film structure according to Comparative Example 3.

FIG. 8 is a graph schematically illustrating electric field dependency of polarization of each piezoelectric film included in the film structure according to the first embodiment. FIG. 9 is a graph schematically illustrating electric field dependency of polarization of a piezoelectric film included in the film structure according to Comparative Example 3. FIG. 8 is a graph schematically illustrating a polarization electric field hysteresis curve representing a change in polarization of the piezoelectric films 14 and 15 when the electric field between the lower electrode (conductive film 13) and the upper electrode (conductive film 16) included in the film structure 10 according to the first embodiment illustrated in FIG. 2 is changed.

As illustrated in FIG. 7, when the piezoelectric film 14 is formed by a coating method, the piezoelectric film 14 includes a plurality of films 14a as layers laminated in the thickness direction of the piezoelectric film 14. The film 14a as each of the plurality of layers includes a plurality of crystal grains 14b integrally formed from the lower surface to the upper surface of the single layer film 14a. In addition, pores or voids sometimes remain between the two films 14a adjacent to each other in the thickness direction of the piezoelectric film 14.

When the piezoelectric film 15 is formed by a sputtering method, the piezoelectric film 15 includes a plurality of crystal grains 15a integrally formed from the lower surface to the upper surface of the piezoelectric film 15. In addition, pores or voids are unlikely to remain between the two adjacent crystal grains 15a in the main surface (upper surface 11a in FIG. 1) of the substrate 11. Thus, when a cross section for observation by SEM is processed by a focused ion beam (FIB) method and formed in the piezoelectric film 15, the cross section is likely to be seen as a single cross section, and the crystal grain 15a is difficult to observe.

As illustrated in FIG. 7, preferably, each of the plurality of crystal grains has spontaneous polarization. The spontaneous polarization includes a polarization component P1 parallel to the thickness direction of the piezoelectric film 15, and the polarization components P1 included in the spontaneous polarization of each of the plurality of crystal grains are oriented in an identical direction.

Consider Comparative Example 3 in which the polarization components included in the spontaneous polarization of each of the plurality of crystal grains included in the piezoelectric film 15 are not oriented in an identical direction. In such a case, as illustrated in FIG. 9, the spontaneous polarization of each of the plurality of crystal grains cancels each other, and thus the piezoelectric film 15 (refer to FIG. 7) has no large spontaneous polarization in the initial state. Thus, when the electric field is increased to the positive side from a start point SP at which the electric field is zero, and then returned to zero again, and the electric field is decreased to the negative side and returned to an end point EP at zero again, a hysteresis curve illustrating the electric field dependency of the polarization of the piezoelectric film 15 is a curve with the origin as the start point SP. Thus, when the film structure 10 according to Comparative Example 3 is used as a piezoelectric element, it is necessary to perform polarization processing on the piezoelectric film 15 before use.

As illustrated in FIG. 7, in the first embodiment, the polarization components P1 included in the spontaneous polarization of each of the plurality of crystal grains 15a included in the piezoelectric film 15 are oriented in an identical direction. In such a case, as illustrated in FIG. 8, in the initial state, the piezoelectric film 15 has a large spontaneous polarization. Thus, the hysteresis curve illustrating the electric field dependency of the polarization of the piezoelectric film 15 is a curve with the start point SP at a point away from the origin. Thus, when the film structure 10 according to the first embodiment is used as a piezoelectric element, there is no need to perform polarization processing on the piezoelectric film 15 before use.

The ratio of the thickness of the piezoelectric film 15 to the thickness of the piezoelectric film 14 is not particularly limited, but can be, for example, 1/3 to 1.

<Method for Manufacturing Film Structure>

Next, a method for manufacturing the film structure according to the first embodiment will be described. FIGS. 10 to 13 are cross-sectional views of the film structure according to the first embodiment during a manufacturing process thereof.

Figure 10:
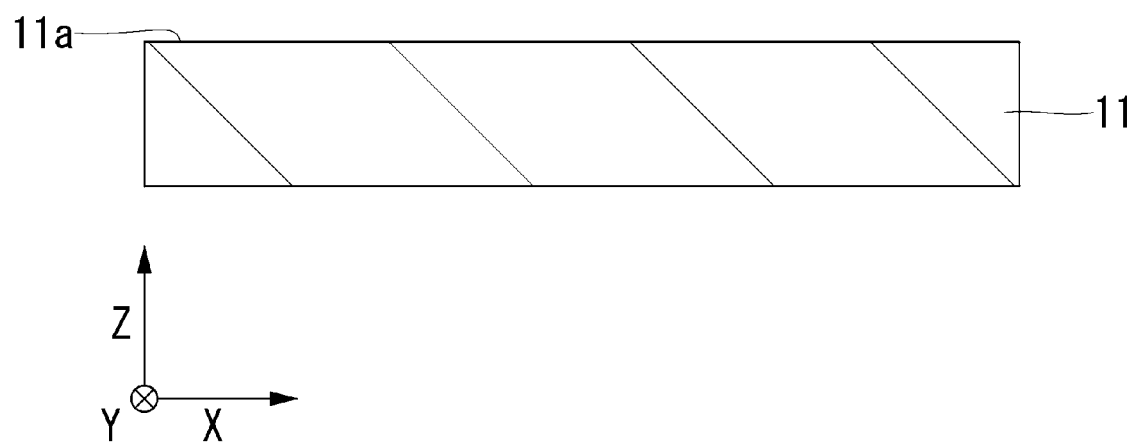
FIG. 10 is a cross-sectional view of the film structure according to the first embodiment during a manufacturing process thereof.

First, as illustrated in FIG. 10, the substrate 11 is prepared (step S1). In step S1, the substrate 11 as a silicon substrate made of silicon (Si) single crystal is prepared. Preferably, the substrate 11 made of silicon single crystal has a cubic crystal structure and includes the upper surface 11a as a main surface made of a (100) plane. When the substrate 11 is a silicon substrate, an oxide film such as a $SiO_2$ film may be formed on the upper surface 11a of the substrate 11.

Various kinds of substrates other than a silicon substrate may be used as the substrate 11. Examples thereof include an SOI (Silicon on Insulator) substrate, a substrate made of various semiconductor single crystals other than silicon, and a substrate made of various oxide single crystals such as sapphire, and a substrate made of a glass substrate including a polysilicon film formed on its surface.

As illustrated in FIG. 10, two directions orthogonal to each other in the upper surface 11a of the (100) plane of the substrate 11 made of silicon single crystal are defined as an X-axis direction and a Y-axis direction, and the direction perpendicular to the upper surface 11a is defined as a Z-axis direction.

Figure 11:
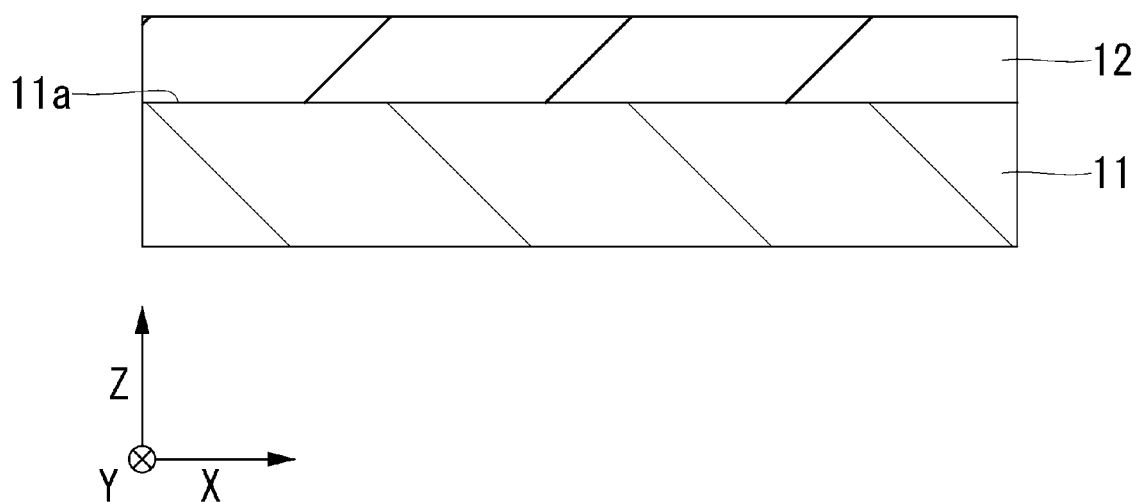
FIG. 11 is a cross-sectional view of the film structure according to the first embodiment during the manufacturing process thereof.

Next, as illustrated in FIG. 11, the oriented film 12 is formed on the substrate 11 (step S2). The following describes an example in which the oriented film 12 is formed by an electron beam evaporation method in step S2, but the oriented film 12 may be formed by various methods such as a sputtering method.

In step S2, the substrate 11 is first heated to, for example, 700° C. while the substrate 11 is placed in a constant vacuum atmosphere.

Next, in step S2, Zr is evaporated by an electron beam evaporation method using a deposition material of zirconium (Zr) single crystal. The evaporated Zr reacts with oxygen on the substrate 11 heated at, for example, 700° C. to form a zirconium oxide ($ZrO_2$) film. In this manner, the oriented film 12 made of the $ZrO_2$ film as a single layer film is formed.

The oriented film 12 epitaxially grows on the upper surface 11a as the main surface made of the (100) plane of the substrate 11 made of silicon single crystal. The oriented film 12 contains zirconium oxide ($ZrO_2$) having a cubic crystal structure and being (100) oriented. Thus, the oriented film 12 of a single layer film containing (100)-oriented zirconium oxide ($ZrO_2$) is formed on the upper surface 11a of the (100) plane of the substrate 11 made of silicon single crystal.

As described above with reference to FIG. 10, two directions orthogonal to each other in the upper surface 11a of the (100) plane of the substrate 11 made of silicon single crystal are defined as the X-axis direction and the Y-axis direction, and a direction perpendicular to the upper surface 11a is defined as the Z-axis direction. The expression that a certain film is epitaxially grown means that the film is oriented in each of the X-axis direction, the Y-axis direction, and the Z-axis direction.

The film thickness of the oriented film 12 is preferably 2 nm to 100 nm, and more preferably 10 nm to 50 nm. When having such a film thickness, the oriented film 12 can be epitaxially grown and formed to be very close to single crystal.

Figure 12:
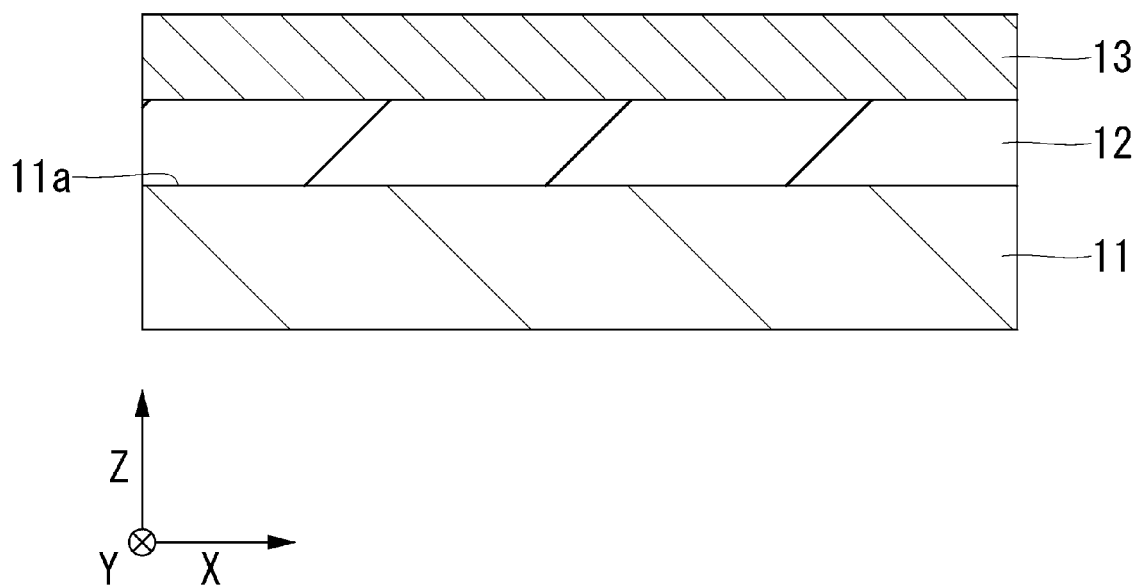
FIG. 12 is a cross-sectional view of the film structure according to the first embodiment during the manufacturing process thereof.

Next, as illustrated in FIG. 12, the conductive film 13 is formed (step S3). In this step S3, the conductive film 13 as a lower electrode is formed on the oriented film 12. The conductive film 13 is made of metal or metal oxide. The conductive film 13 made of metal is, for example, a conductive film containing platinum (Pt) or iridium (Ir). The conductive film 13 made of metal oxide is, for example, a conductive film containing $Sr(Ti_zRu_{1-z})O_3$. In the above composition formulae, z satisfies $0 \leq z \leq 0.4$.

When a conductive film containing platinum is formed as the conductive film 13, the conductive film 13 is formed as a lower electrode on the oriented film 12 through epitaxial growth by a sputtering method at a temperature of 550° C. or lower (preferably at a temperature of 400° C.). The conductive film 13 containing platinum is epitaxially grown on the oriented film 12. The platinum contained in the conductive film 13 has a cubic crystal structure and is (100) oriented.

Figure 13:
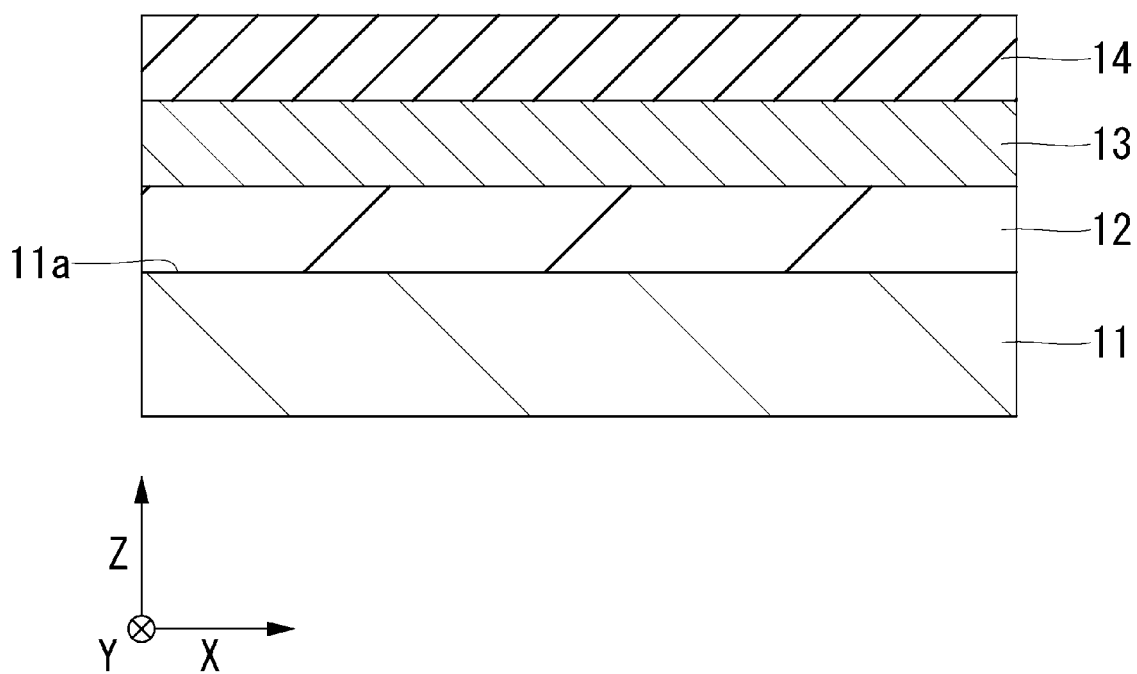
FIG. 13 is a cross-sectional view of the film structure according to the first embodiment during the manufacturing process thereof.

Next, as illustrated in FIG. 13, the piezoelectric film 14 is formed on the conductive film 13 (step S4). In this step S4, the piezoelectric film 14 is formed by a coating method such as a sol-gel method. The following describes a method for forming the piezoelectric film 14 by the sol-gel method.

In step S4, first, the process of coating the conductive film 13 with a solution containing lead, zirconium, and titanium to form a film containing a precursor of the composite oxide (PZT) represented by the above composition formula (1) is repeated a plurality of times. Accordingly, a film including a plurality of films laminated to each other is formed.

In step S4, the piezoelectric film 14 containing the composite oxide represented by the above composition formula (1) is formed by heat-treating the film to oxidize and crystallize the precursor. In the above composition formula, x satisfies $0.10 < x \leq 0.20$. In addition, the PZT contained in the piezoelectric film 14 has a rhombohedral crystal structure and is (100) oriented.

In step S4, for example, the piezoelectric film 14 has tensile stress due to the evaporation of a solvent in the solution during heat-treatment or the shrinkage of the film when the precursor is oxidized and crystallized.

Next, as illustrated in FIG. 1, the piezoelectric film 15 is formed on the piezoelectric film 14 (step S5). In this step S5, the piezoelectric film 15 containing composite oxide (PZT) represented by the composition formula (2) is formed by a sputtering method. In the above composition formula, y satisfies $0.35 \leq y \leq 0.55$. When y satisfies $0.35 \leq y \leq 0.48$, the PZT contained in the piezoelectric film 15 has a rhombohedral crystal structure and is (100) oriented. When y satisfies $0.48 < y \leq 0.55$, the PZT contained in the piezoelectric film 15 has a tetragonal crystal structure and is (001) oriented.

In step S5, the piezoelectric film 15 including a plurality of crystal grains is formed by a sputtering method. Specifically, the piezoelectric film 15 including a plurality of crystal grains integrally formed from the lower surface to the upper surface of the piezoelectric film 15 is formed.

For example, when the piezoelectric film 15 is formed by a sputtering method, each of a plurality of crystal grains 15a (refer to FIG. 7) included in the piezoelectric film 15 can be polarized by plasma. Thus, each of the plurality of crystal grains 15a included in the formed piezoelectric film 15 has spontaneous polarization. The spontaneous polarization of each of the plurality of crystal grains 15a includes a polarization component parallel to the thickness direction of the piezoelectric film 15. The polarization components included in the spontaneous polarization of each of the plurality of crystal grains 15a are oriented in an identical direction. As a result, the formed piezoelectric film 15 has spontaneous polarization as a whole before polarization processing.

Thus, in step S5, when the piezoelectric film 15 is formed by a sputtering method, the piezoelectric film 15 can be polarized by plasma. As a result, as described with reference to FIGS. 7 and 9, when the film structure 10 according to the first embodiment is used as a piezoelectric element, there is no need to perform polarization processing on the piezoelectric film 15 before use.

In step S5, when the piezoelectric film 15 is formed by a sputtering method, for example, sputtered particles and argon (Ar) gas are injected into the piezoelectric film 15 so that the piezoelectric film 15 expands to obtain compressive stress.

In this manner, the film structure 10 illustrated in FIG. 1 is formed. After the piezoelectric film 15 is formed, the conductive film 16 (refer to FIG. 2) as the upper electrode may be formed on the piezoelectric film 15 in step S6.

Second Embodiment

In the first embodiment, the piezoelectric film is directly formed on the conductive film as the lower electrode. However, an oxide film may be formed on the conductive film as the lower electrode, and a piezoelectric film may be formed on the oxide film. Such an example will be described as the second embodiment.

<Film Structure>

Figure 14:
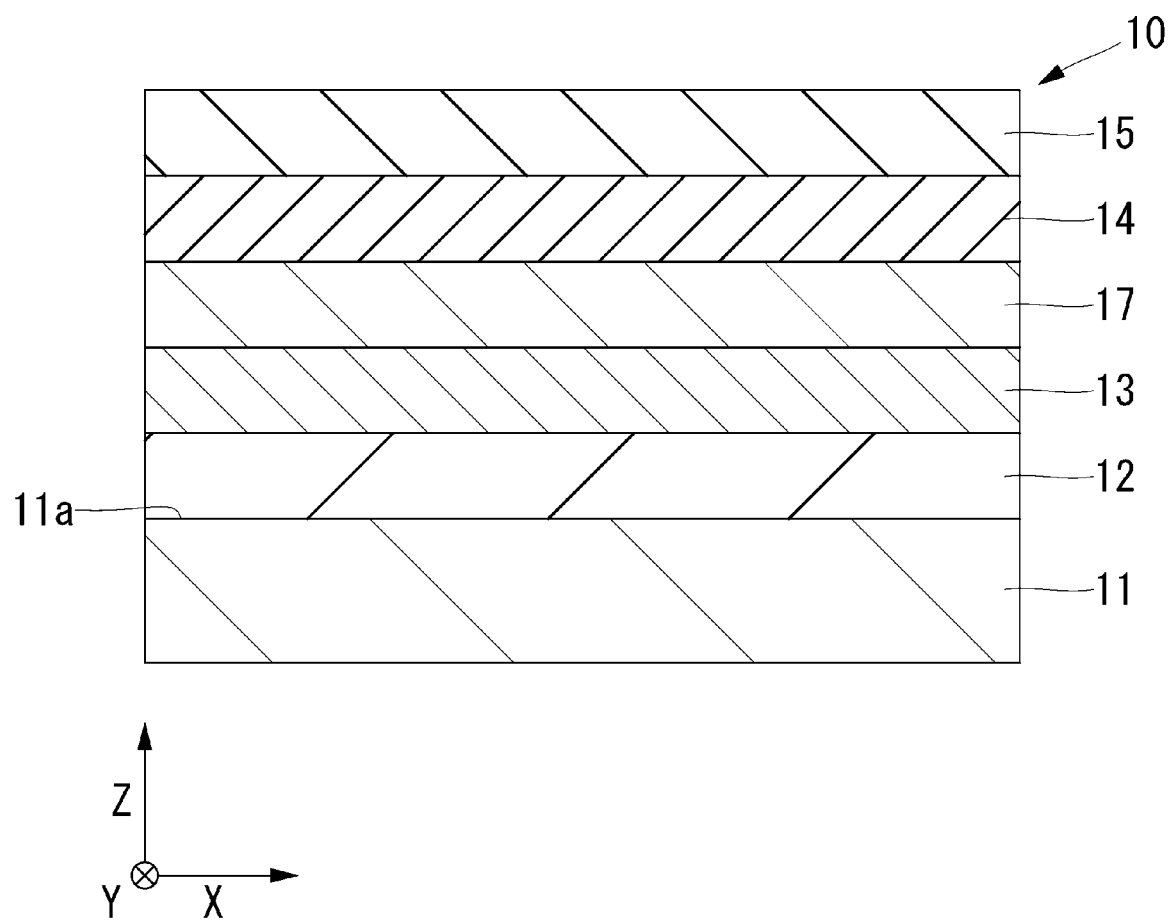
FIG. 14 is a cross-sectional view of a film structure according to a second embodiment.
Figure 15:
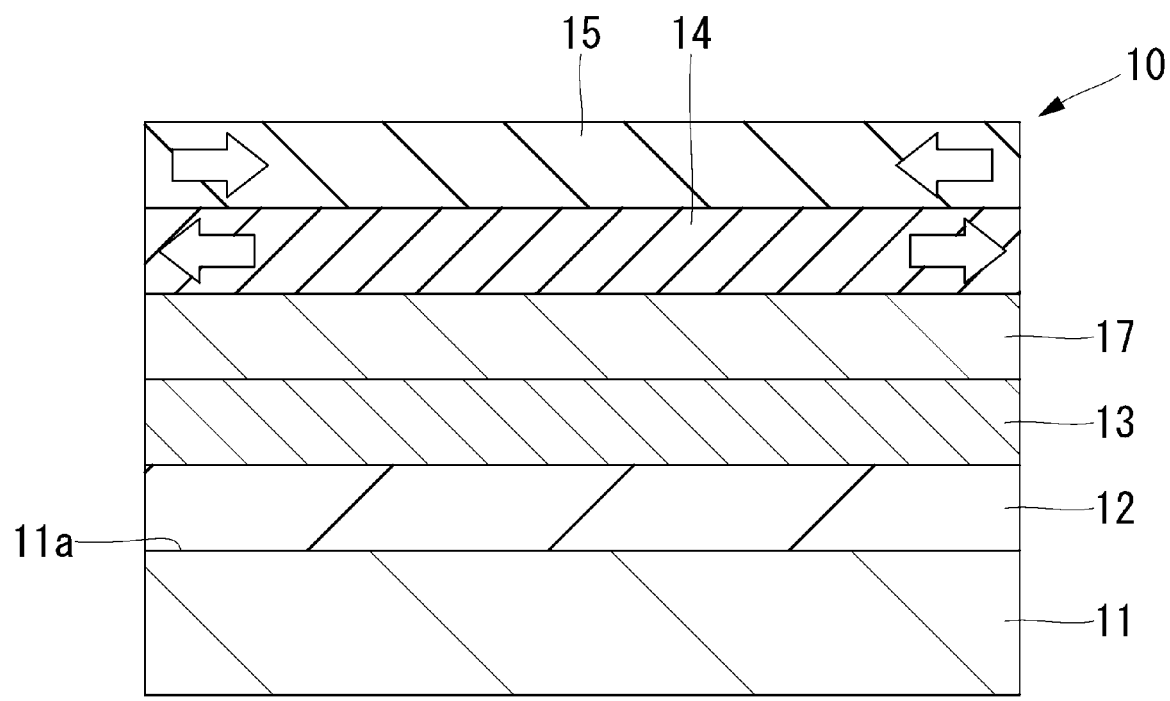
FIG. 15 is a cross-sectional view of the film structure according to the second embodiment.

FIG. 14 and FIG. 15 are cross-sectional views of a film structure according to the second embodiment. FIG. 15 schematically illustrates stress of the piezoelectric film in addition to the sectional view of the film structure illustrated in FIG. 14.

As illustrated in FIG. 14, the film structure 10 according to the second embodiment has the substrate 11, the oriented film 12, the conductive film 13, an oxide film 17, the piezoelectric film 14, and the piezoelectric film 15. The oriented film 12 is formed on the substrate 11. The conductive film 13 is formed on the oriented film 12. The oxide film 17 is formed on the conductive film 13. The piezoelectric film 14 is formed on the oxide film 17. The piezoelectric film 15 is formed on the piezoelectric film 14.

Thus, the film structure 10 according to the second embodiment is same as the film structure 10 according to the first embodiment except that the oxide film 17 is formed on the conductive film 13 as the lower electrode and the piezoelectric film 14 is formed on the oxide film 17.

The oxide film 17 preferably contains composite oxide having a perovskite structure. For example, the oxide film 17 contains composite oxide represented by a composition formula below (3).

$$Sr(Ti_zRu_{1-z})O_3 \qquad (3)$$

In the above composition formula, z preferably satisfies $0 \leq z \leq 0.4$, more preferably satisfies $0.05 \leq z \leq 0.2$. When z exceeds 0.4, the composite oxide represented by the above composition formula (3) becomes powder and is potentially not solidified sufficiently.

Also in the second embodiment, as in the first embodiment, the piezoelectric film 14 includes composite oxide (PZT) represented by the above composition formula (1), and x satisfies $0.10 < x \leq 0.20$. Accordingly, the PZT contained in the piezoelectric film 14 has a rhombohedral crystal structure and is likely to be (100) oriented.

Also in the second embodiment, as in the first embodiment, the piezoelectric film 15 contains composite oxide (PZT) represented by the above composition formula (2), and y satisfies $0.35 \leq y \leq 0.55$. Accordingly, the piezoelectric constant of the piezoelectric film 15 can be increased.

In addition, also in the second embodiment, as illustrated in FIG. 15, the piezoelectric film 14 has tensile stress as in the first embodiment. The piezoelectric film 15 has compressive stress. Thus, a warp amount by which the film structure 10 is warped can be reduced as compared to a case in which both the piezoelectric film 14 and the piezoelectric film 15 have tensile stress, and a warp amount by which the film structure 10 is warped can be reduced as compared to a case in which both of the piezoelectric film 14 and the piezoelectric film 15 have compressive stress.

In addition, in the second embodiment, unlike the first embodiment, the oxide film 17 is formed on the conductive film 13 as the lower electrode, and the piezoelectric film 14 is formed on the oxide film 17. As described above, the oxide film 17 contains composite oxide having a perovskite structure. In addition, the composite oxide represented by the above composition formula (1) also has a perovskite structure. Thus, the piezoelectric film 14 containing the composite oxide (PZT) represented by the above composition formula (1) is likely to be formed on the oxide film 17.

Preferably, the oxide film 17 containing the composite oxide represented by the above composition formula (3) has a cubic or pseudocubic crystal structure and is (100) oriented. The piezoelectric film 14 containing the composite oxide represented by the above composition formula (1) can be easily epitaxially grown on the oxide film 17 having a cubic crystal structure. Thus, the piezoelectric constant of the piezoelectric film 14 can be further increased.

<Method for Manufacturing Film Structure>

Figure 16:
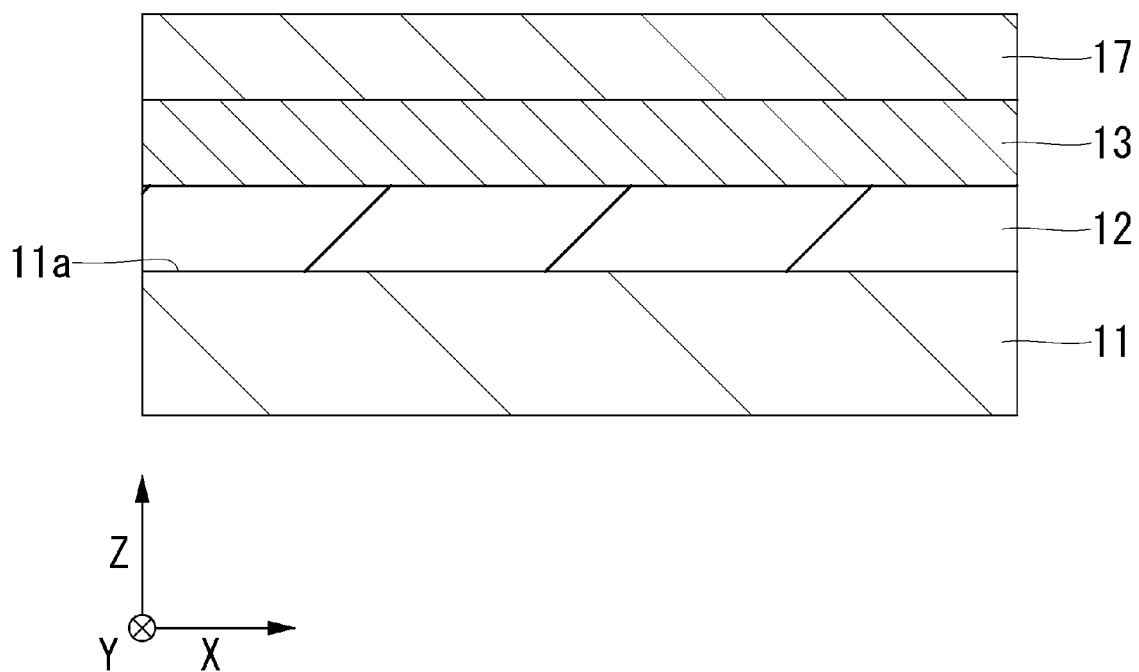
FIG. 16 is a cross-sectional view of the film structure according to the second embodiment during a manufacturing process thereof.

The following describes a method for manufacturing the film structure according to the second embodiment. FIG. 16 is a cross-sectional view of the film structure according to the second embodiment during a manufacturing process thereof.

In the second embodiment, first, as illustrated in FIGS. 10 to 12, the same steps as steps S1 to S3 in the first embodiment are performed to form the oriented film 12 and the conductive film 13 on the substrate 11.

Next, as illustrated in FIG. 16, the oxide film 17 is formed on the conductive film 13 (step S7). In this step S7, unlike the first embodiment, the oxide film 17 containing the composite oxide represented by the above composition formula (3) is formed by a sputtering method. In the above composition formula, z satisfies $0 \leq z \leq 0.4$.

Thereafter, the same steps as steps S4 and S5 in the first embodiment are performed to form the piezoelectric film 14 and the piezoelectric film 15 on the oxide film 17.

In this manner, the film structure 10 illustrated in FIG. 14 is formed. After the piezoelectric film 15 is formed, the conductive film 16 (refer to FIG. 2) as the upper electrode may be formed on the piezoelectric film 15 in step S6.

EXAMPLES

The present embodiment will be explained below in more detail based on examples. The present invention is not limited by the following examples.

Example 1

The film structure described in the first embodiment with reference to FIG. 1 was formed as a film structure according to Example 1.

First, as illustrated in FIG. 10, a wafer having the upper surface 11a as a main surface made of a (100) plane and made of a 6-inch silicon single crystal was prepared as the substrate 11.

Next, as illustrated in FIG. 11, a zirconium oxide ($ZrO_2$) film was formed as the oriented film 12 on the substrate 11 by an electron beam evaporation method. The conditions in this case are as listed in Table 1. The formed oriented film 12 had a cubic crystal structure and was (100) oriented. The film thickness of the formed oriented film 12 was 100 nm.

Next, as illustrated in FIG. 12, a platinum (Pt) film was formed as the conductive film 13 on the oriented film 12 by a sputtering method. The conditions in this case are as listed in Table 1. The formed conductive film 13 had a cubic crystal structure and was (100) oriented.

TABLE 1

| Process | Vapor deposition | DC-sputtering |
| --- | --- | --- |
| Depo Vac (Torr) | $6.90 \times 10^{-3}$ | $3.20 \times 10^{-2}$ |
| Depo Source | $Zr + O_2$ | Pt |
| ACC/Emission | 7.5 kV/1.50 mA | DC/100 W |
| Total Thickness (nm) | 13.4 | 100 |
| Depo Time (sec) | 930 | 720 |
| SV deg (° C.) | 500 | 400 |
| MFC $O_2$ | 5 sccm | Ar: 16 sccm |

Figure 17:
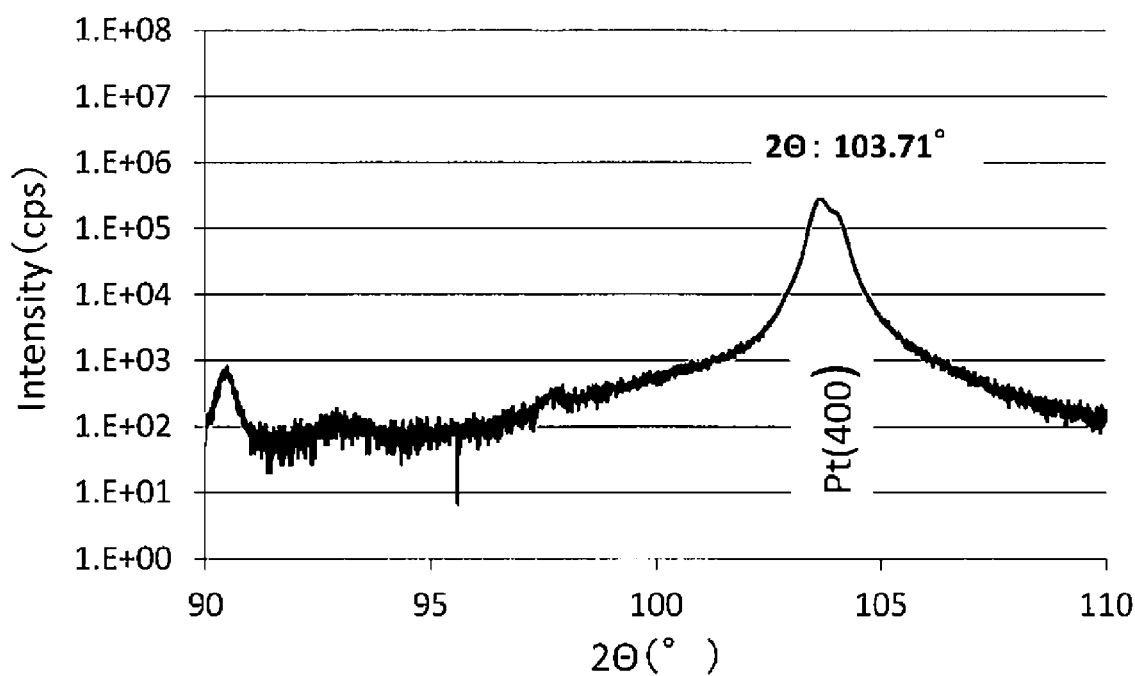
FIG. 17 is a graph illustrating a $\theta$-$2\theta$ spectrum of a film structure having a conductive film formed, which is obtained by an X-ray diffraction (XRD) method.

FIG. 17 is a graph illustrating a θ-2θ spectrum of a film structure having a conductive film formed, which is obtained by an X-ray diffraction (XRD) method. The horizontal axis of the graph in FIG. 17 represents the angle 2θ, and the vertical axis of the graph in FIG. 17 represents the intensity of the X-ray. In the θ-2θ spectrum illustrated in FIG. 17, since a peak was observed at the position of 2θ=103.71°, which corresponds to (400) of platinum, it was found that the conductive film 13 contained (100)-oriented platinum.

Then, as illustrated in FIG. 13, a laminated film was formed by laminating a $Pb(Zr_{0.85}Ti_{0.15})O_3$ film as the piezoelectric film 14 on the conductive film 13 by a spin coating method. The conditions in this case were as follows.

Pb, Zr, and Ti were mixed so as to have a composition ratio of Pb:Zr:Ti=100+δ:85:15, and a raw material solution was prepared by dissolving $Pb(Zr_{0.85}Ti_{0.15})O_3$ at the concentration of 0.35 mol/l in a mixed solvent of ethanol and 2-n-butoxyethanol. In the composition ratio, δ is the surplus Pb amount taking account of the volatilization of Pb oxide in a subsequent heat-treatment process, and δ is 20 in this example. Further, polypyrrolidone having a weight of 20 g and a K value of 27 to 33 was dissolved in the raw material solution.

Next, 3 ml of the raw material solution of the prepared raw material solution was dropped onto the substrate 11 made of a 6 inch wafer. While the substrate 11 was rotated at 3000 rpm for 10 seconds, the raw material solution was applied onto the substrate 11 to form a film containing a precursor. Then, the substrate 11 was placed on a hot plate at a temperature of 200° C. for 30 seconds, and then placed on a hot plate at a temperature of 450° C. for 30 seconds to dry the film by evaporating the solvent. Thereafter, the precursor was heat-treated at 650° C. for 60 seconds in an oxygen ($O_2$) atmosphere of 0.2 MPa to crystallize the precursor, thereby forming a piezoelectric film having a film thickness of 100 nm. These steps from the application of the raw material solution to the crystallization were repeated, for example, five times to form the piezoelectric film 14 having a film thickness of, for example, 500 nm.

Next, as illustrated in FIG. 1, a $Pb(Zr_{0.85}Ti_{0.45})O_3$ film was formed as the piezoelectric film 15 on the piezoelectric film 14 by a sputtering method. The conditions in this case were as follows.

Figure 18:
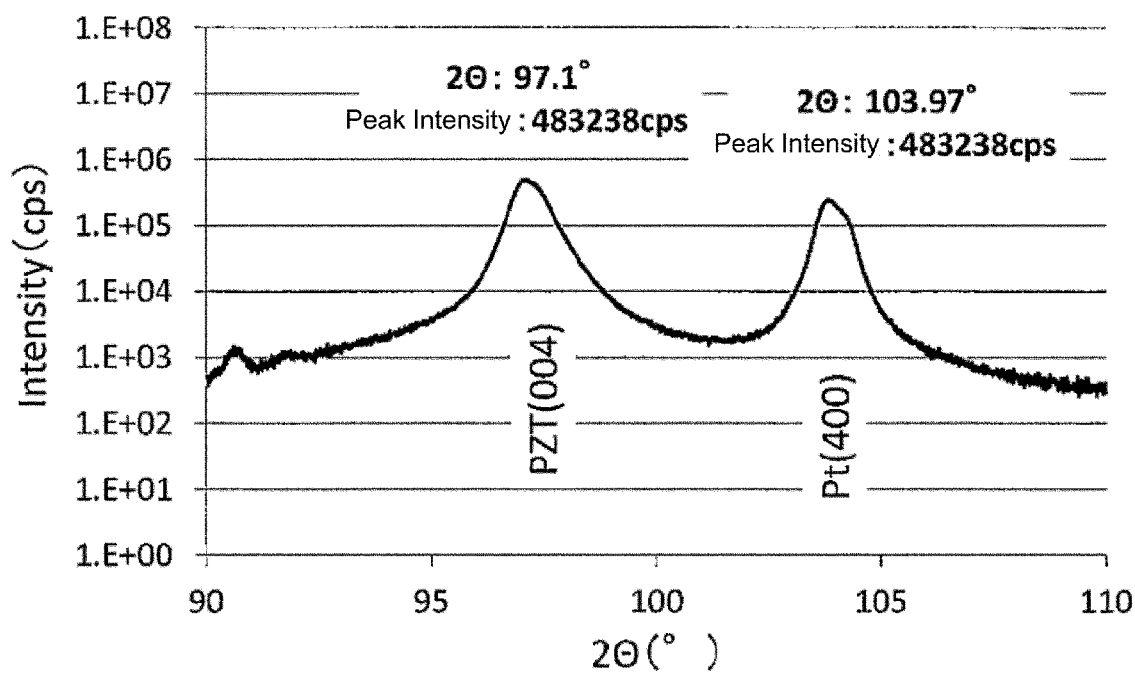
FIG. 18 is a graph illustrating a $\theta$-$2\theta$ spectrum of a film structure having two piezoelectric films formed by the XRD method.

Apparatus: RF magnetron sputtering apparatus
Power: 2500 W
Gas: Ar/$O_2$
Pressure: 0.14 Pa
Substrate temperature: 500° C.
Deposition rate: 0.63 nm/sec FIG. 18 is a graph illustrating a θ-2θ spectrum of a film structure having two piezoelectric films formed by the XRD method. The horizontal axis of the graph in FIG. 18 represents the angle 2θ, and the vertical axis of the graph in FIG. 18 represents the intensity of the X-ray. In the θ-2θ spectrum illustrated in FIG. 18, a peak observed at the position of 2θ=97.1°, which corresponds to (004) of PZT, indicates that the piezoelectric film 14 and the piezoelectric film 15 contained (001)-oriented PZT.

In addition, the substrate 11 deformed from an upwardly convex shape to a downwardly convex shape upon formation of the piezoelectric film 14. This indicates that the piezoelectric film 14 had tensile stress. In addition, the substrate 11 deformed from a downwardly convex shape to an upwardly convex shape upon the formation of the piezoelectric film 15. This indicates that the piezoelectric film 15 had compressive stress.

Example 2

The film structure described with reference to FIG. 14 in the second embodiment was formed as a film structure according to Example 2.

First, as illustrated in FIGS. 10 to 12, the oriented film 12 and the conductive film 13 were sequentially formed on the substrate 11 by a method same as the method described in Example 1.

Next, as illustrated in FIG. 16, a SrRuO₃ film was formed as the oxide film 17 on the conductive film 13 by a sputtering method. The conditions in this case were as follows.
Apparatus: RF magnetron sputtering apparatus
Power: 300 W
Gas: Ar
Pressure: 1.8 Pa
Substrate temperature: 600° C.
Deposition rate: 0.11 nm/sec
Film thickness: 20 nm Thereafter, as illustrated in FIG. 14, the piezoelectric film 14 and the piezoelectric film 15 were sequentially formed on the oxide film 17 by the method as described in Example 1. Although not illustrated, the same result as in FIG. 18 is obtained as a graph illustrating the θ-2θ spectrum of the film structure in which the two piezoelectric films are formed by the XRD method, which indicates that the piezoelectric film 14 and the piezoelectric film 15 contained (001)-oriented PZT.

Examples 3 to 5 and Comparative Examples 4 and 5

Film structures similar to the film structure according to Example 2 were formed as film structures according to Examples 3 to 5. Each of the film structures according to Examples 3 to 5 was similar to the film structure according to Example 2 and each had a cross-sectional structure illustrated in FIG. 14. However, the ratio of the thickness of the piezoelectric film 15 to the thickness of the piezoelectric film 14 was different between the film structures of Examples 3 to 5.

In addition, film structures according to Comparative Examples 4 and 5 were formed. The film structure according to Comparative Example 4 was a film structure same as the film structure according to Comparative Example 1 having a cross-sectional structure illustrated in FIG. 5, except that film structure according to Comparative Example 4 had the oxide film 17. The film structure according to Comparative Example 5 was a film structure same as the film structure according to Comparative Example 2 having a sectional structure illustrated in FIG. 6, except that film structure according to Comparative Example 5 had the oxide film 17. Accordingly, in the film structure according to Comparative Example 4, both the piezoelectric film 14 and the piezoelectric film 15 had tensile stress. In the film structure according to Comparative Example 5, both the piezoelectric film 14 and the piezoelectric film 15 had compressive stress.

The film thickness of the piezoelectric film 14 in each of the film structures of Examples 3 to 5 and Comparative Examples 4 and 5, and the film thickness of the piezoelectric film 15 in each of the film structures of Examples 3 to 5 and Comparative Examples 4 and 5 were as follows.

|  | Thickness of piezoelectric film 14 | Thickness of piezoelectric film 15 |
| --- | --- | --- |
| Example 3: | 500 nm | 500 nm |
| Example 4: | 1000 nm | 500 nm |
| Example 5: | 1500 nm | 500 nm |
| Comparative Example 4: | 500 nm | 500 nm |
| Comparative Example 5: | 500 nm | 500 nm |

Figure 19:
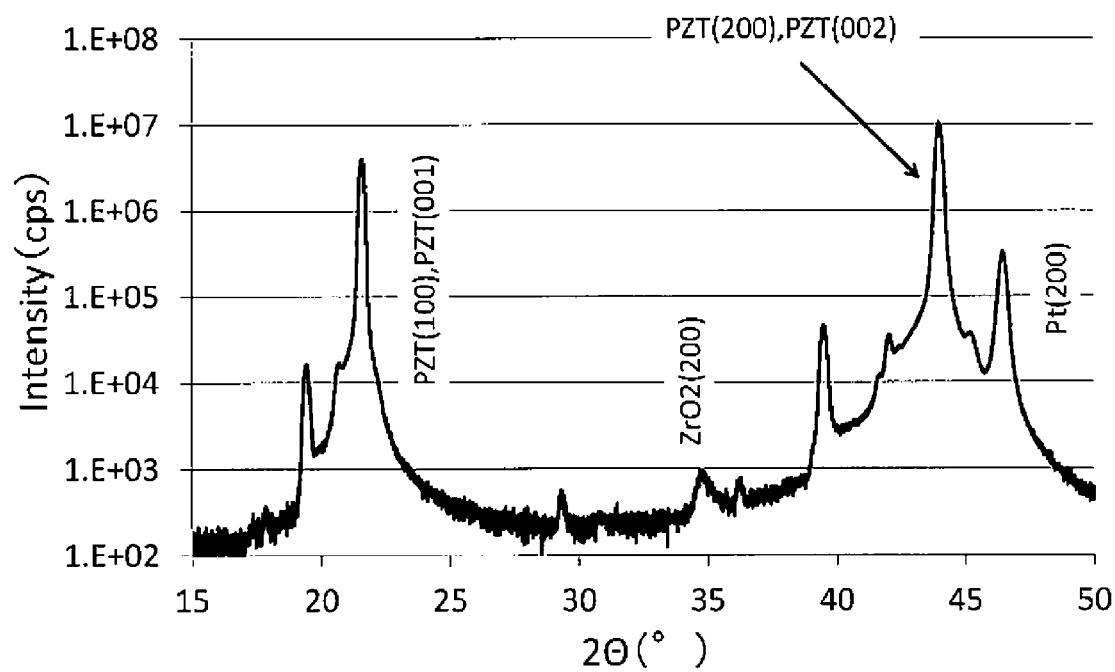
FIG. 19 is a graph illustrating a $\theta$-$2\theta$ spectrum of the film structure according to Example 3 obtained by the XRD method.
Figure 20:
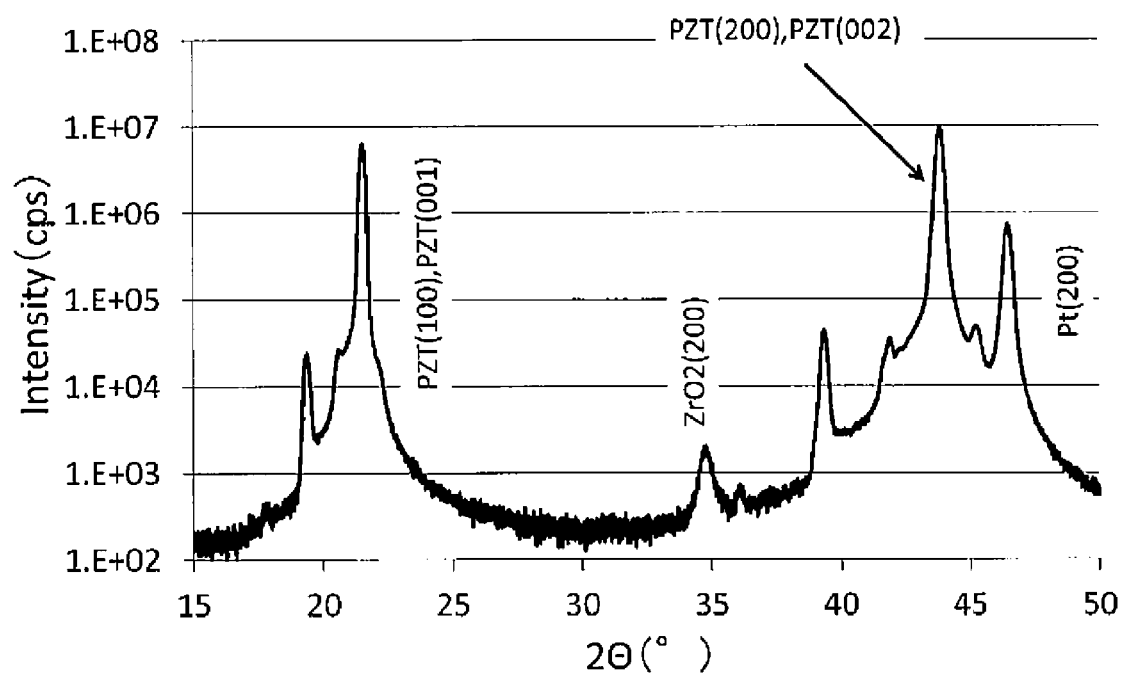
FIG. 20 is a graph illustrating a $\theta$-$2\theta$ spectrum of the film structure according to Example 4 obtained by the XRD method.
Figure 21:
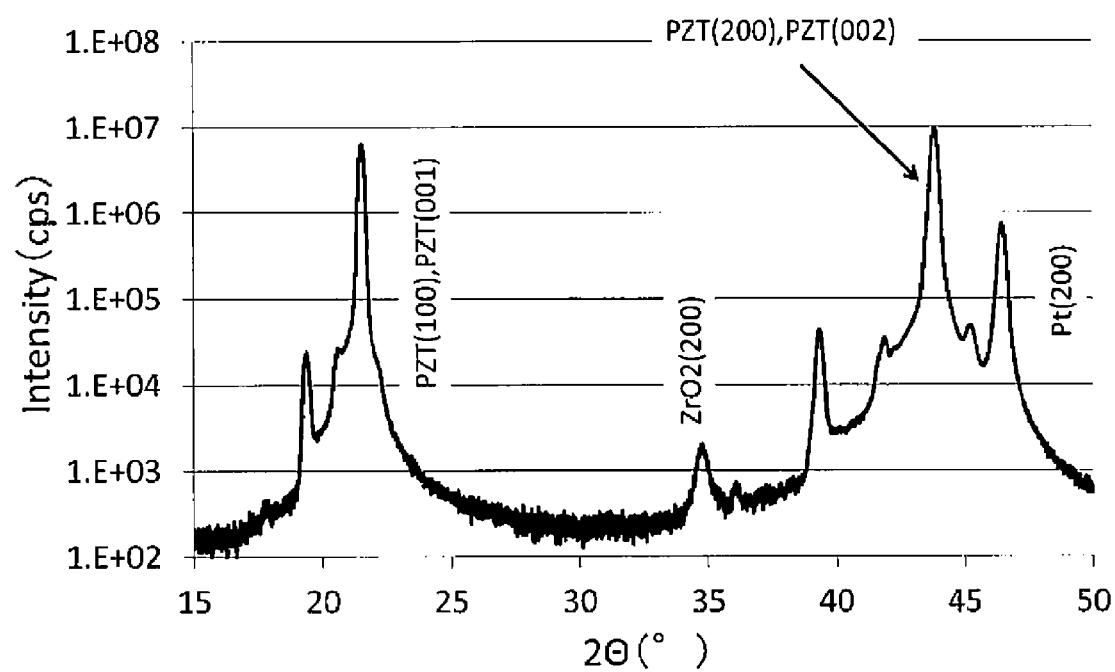
FIG. 21 is a graph illustrating a $\theta$-$2\theta$ spectrum of the film structure according to Example 5 obtained by the XRD method.

FIG. 19 is a graph illustrating the θ-2θ spectrum of the film structure according to Example 3, which was obtained by the XRD method. FIG. 20 is a graph illustrating the θ-2θ spectrum of the film structure according to Example 4, which was obtained by the XRD method. FIG. 21 is a graph illustrating the θ-2θ spectrum of the film structure according to Example 5, which was obtained by the XRD method. Each of FIGS. 19 to 21 illustrates a range of 15°≤2θ≤50°.

As illustrated in FIGS. 19 to 21, in each of Examples 3 to 5, it was found that a crystal film of PZT was formed with almost no difference observed in the crystallinity of the piezoelectric film 14 and the piezoelectric film 15 in the range of 15°≤2θ≤50°.

Figure 22:
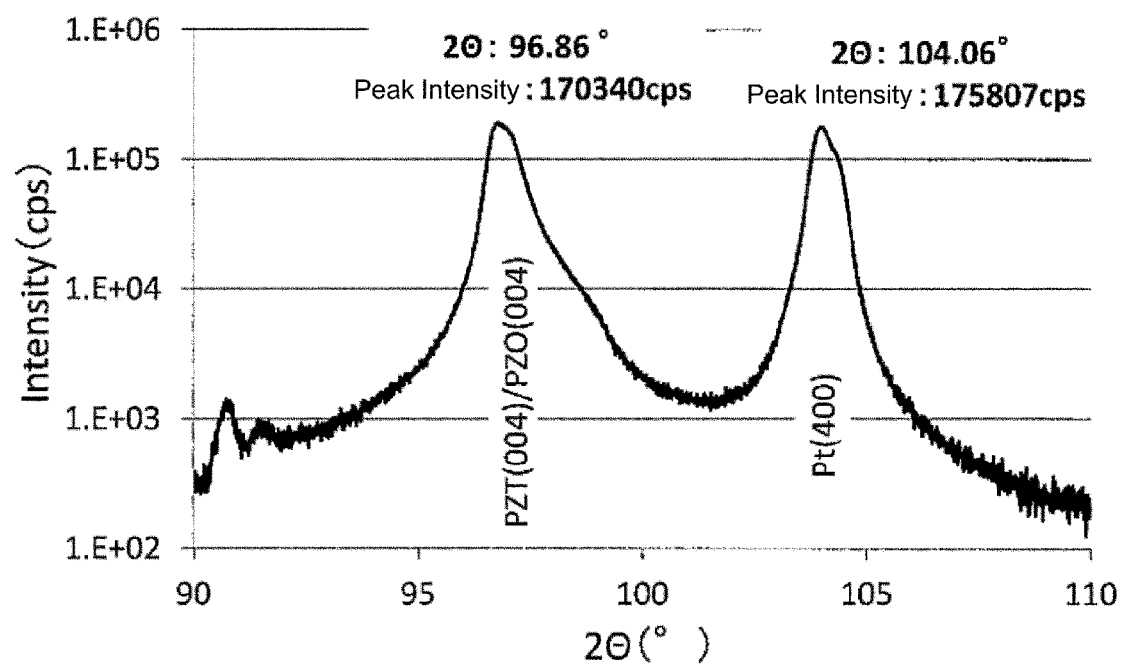
FIG. 22 is a graph illustrating a $\theta$-$2\theta$ spectrum of the film structure according to Example 3 obtained by the XRD method.
Figure 23:
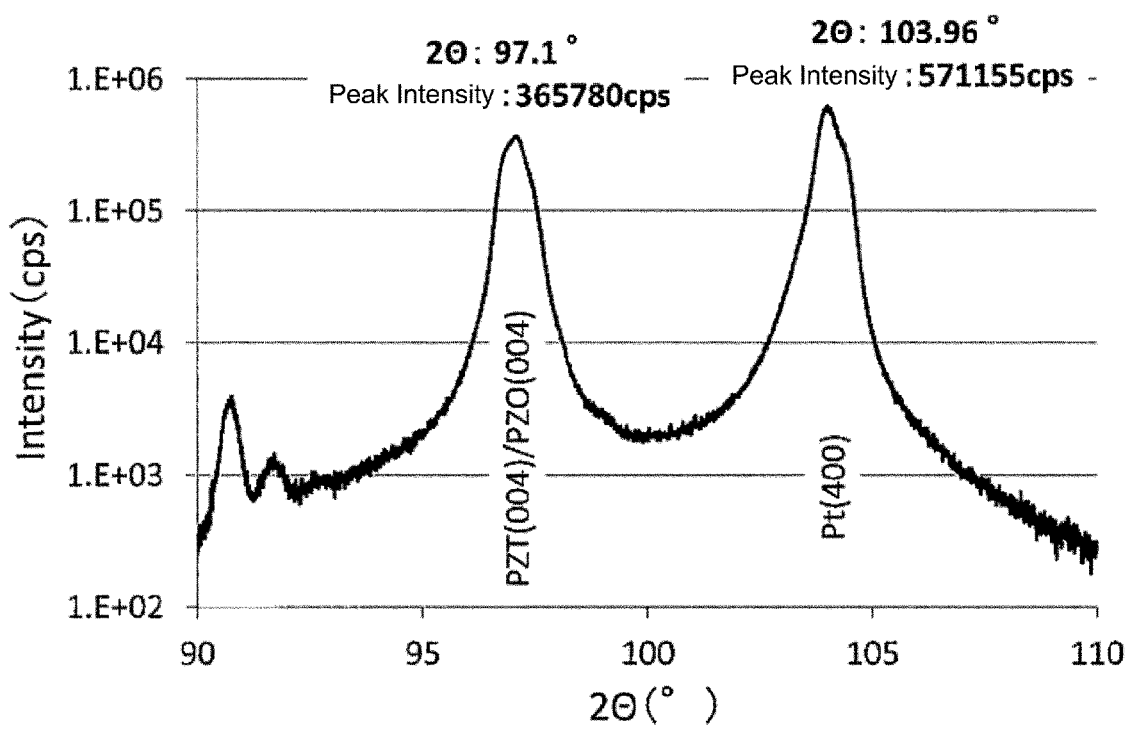
FIG. 23 is a graph illustrating a $\theta$-$2\theta$ spectrum of the film structure according to Example 4 obtained by the XRD method.
Figure 24:
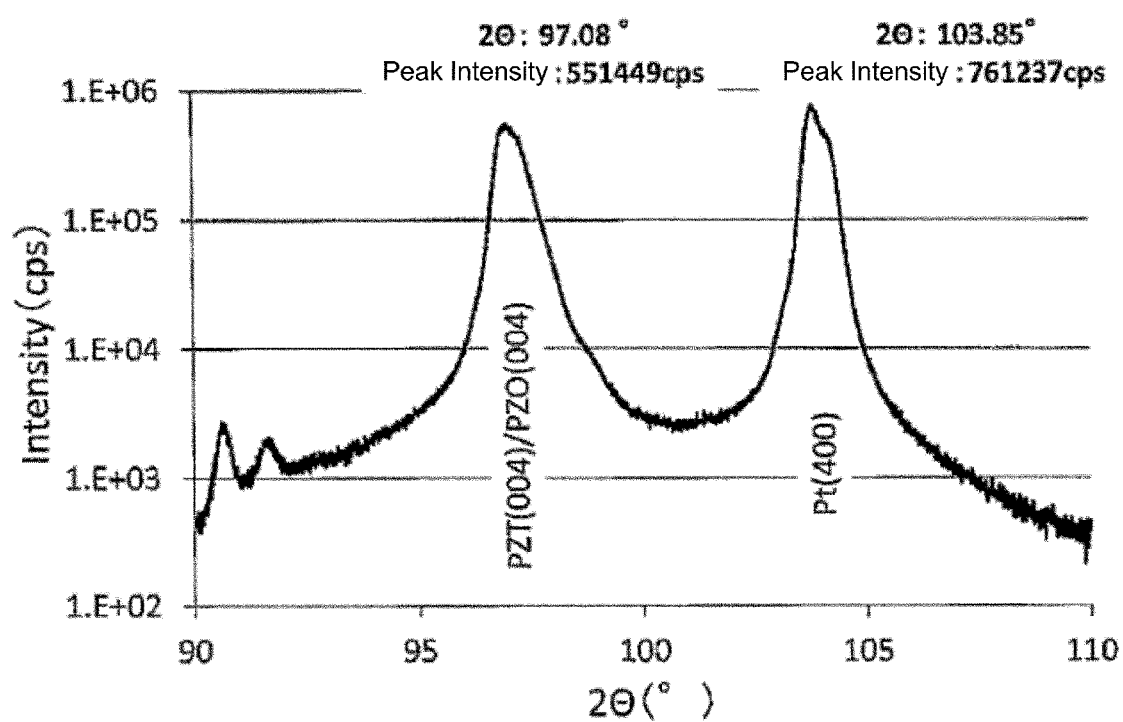
FIG. 24 is a graph illustrating a $\theta$-$2\theta$ spectrum of the film structure according to Example 5 obtained by the XRD method.

FIG. 22 is a graph illustrating the θ-2θ spectrum of the film structure according to Example 3, which was obtained by the XRD method. FIG. 23 is a graph illustrating the θ-2θ spectrum of the film structure according to Example 4, which was obtained by the XRD method. FIG. 24 is a graph illustrating the θ-2θ spectrum of the film structure according to Example 5, which was obtained by the XRD method. FIGS. 22 to 24 illustrate results in the range of 90°≤2θ≤110°.

Table 2 lists the peak angles 2θ and the peak intensities of PZT (004) and Pt (400) obtained from the θ-2θ spectrum in FIGS. 22 to 24. Table 2 also lists the warp amounts of the substrates of the film structures according to Examples 3 to 5 and Comparative Examples 4 and 5.

TABLE 2

|  | PZT(004) | | Pt(400) | | Full width at | |
| --- | --- | --- | --- | --- | --- | --- |
|  | Peak angle 2θ (°) | Peak intensity (cps) | Peak angle 2θ (°) | Peak intensity (cps) | half maximum Half width (°) | Warp amount |
| Example 3 | 96.86 | 170340 | 104.06 | 175807 | 0.79 | Small |
| Example 4 | 97.1 | 365780 | 103.96 | 571155 | 0.68 | Small |
| Example 5 | 97.08 | 551449 | 103.85 | 761237 | 0.66 | Small |
| Comparative Example 4 | — | — | — | — | — | Large (downwardly convex) |
| Comparative Example 5 | — | — | — | — | — | Large (upwardly convex) |

As illustrated in Table 2, in Examples 3 to 5, the peak angle of the (004) peak of PZT was in an extremely low angle region of 2θ≤97.1° in all cases in which the film thickness of the piezoelectric film 14 was 500 nm, 1000 nm, and 1500 nm. In Examples 3 to 5, it was found that the peak intensity of the (004) peak of PZT is not less than 340000 cps per 1000 nm of film thickness, and the crystallinity of PZT is excellent.

As illustrated in Table 2, in Examples 3 to 5, the full width at half maximum (FWHM) was less than 0.8°, which is a small value equivalent to the FWHM in a single crystal. Thus, it was found that the crystallinity of PZT is excellent in the piezoelectric film 14 and the piezoelectric film 15 according to Examples 3 to 5.

Substantially same results of excellent crystallinity of PZT were obtained in Comparative Examples 4 and 5 although numerical values thereof are omitted in Table 2.

However, as illustrated in Table 2, in Comparative Example 4, both of the piezoelectric film 14 and the piezoelectric film 15 had tensile stress, so that the substrate 11 was warped in a downwardly convex shape. In Comparative Example 5, both the piezoelectric film 14 and the piezoelectric film 15 had compressive stress, so that the substrate 11 was warped in an upwardly convex shape.

In Examples 3 to 5, the piezoelectric film 14 had tensile stress and the piezoelectric film 15 had compressive stress. Thus, in Examples 3 to 5, the warp amount of the substrate 11 was smaller than that in Comparative Examples 4 and 5.

REFERENCE SIGNS LIST 10 film structure
11 substrate
11a upper surface
12 oriented film
13, 16 conductive film
14, 15 piezoelectric film
14a film
14b, 15a crystal grain
17 oxide film
EP end point
P1 polarization component
SP start point

The invention claimed is:

1. A film structure comprising:
   a substrate;
   a first film having tensile stress formed on the substrate and comprising a first composite oxide represented by a composition of formula (1) below,

   Pb(Zr$_{1-x}$Ti$_x$)O$_3$; and  (1)

a second film having compressive stress formed on the first film and comprising a second composite oxide represented by a composition of formula (2) below,

   Pb(Zr$_{1-y}$Ti$_y$)O$_3$, wherein  (2)

the x satisfies 0.10<x≤0.20,
   the y satisfies 0.35≤y≤0.55, and
   a full width at half maximum is less than 0.8°.

2. The film structure according to claim 1, wherein
   the first film comprises a plurality of layers laminated on each other, and
   the second film comprises a plurality of crystal grains integrally formed from a lower surface to an upper surface of the second film.

3. The film structure according to claim 2, wherein
   each of the plurality of crystal grains has spontaneous polarization,
   the spontaneous polarization includes a polarization component parallel to a thickness direction of the second film, and
   the polarization components included in the spontaneous polarization of each of the plurality of crystal grains are oriented in an identical direction.

4. The film structure according to claim 1, wherein the substrate is a silicon substrate.

5. The film structure according to claim 4, further comprising:
   a third film formed on the silicon substrate; and
   a conductive film formed on the third film, wherein
   the silicon substrate has a main surface made of a (100) plane,
   the third film comprises zirconium oxide having a cubic crystal structure and being (100) oriented,
   the conductive film comprises platinum having a cubic crystal structure and being (100) oriented, and
   the first composite oxide has a rhombohedral crystal structure and is (100) oriented.

6. The film structure according to claim 5, wherein the second composite oxide has a rhombohedral crystal structure and is (100) oriented.

7. The film structure according to claim 5, wherein the second composite oxide has a tetragonal crystal structure and is (001) oriented.

8. A method for manufacturing a film structure, comprising the steps of:
   (a) preparing a substrate;
   (b) forming a first film having tensile stress and comprising a first composite oxide represented by a composition of formula (1) below on the substrate,

   Pb(Zr$_{1-x}$Ti$_x$)O$_3$  (1), wherein forming the first film comprising the steps of:
      (b1) forming a third film comprising a first precursor of the first composite oxide by coating the substrate with a first solution comprising lead, zirconium, and titanium; and
      (b2) heat-treating the third film; and
   (c) forming a second film having compressive stress and comprising a second composite oxide represented by a composition of formula (2) below on the first film by a sputtering method,

   Pb(Zr$_{1-y}$Ti$_y$)O$_3$, wherein  (2)

the x satisfies 0.10<x≤0.20,
   they satisfies 0.35≤y≤0.55,
   to obtain a film structure having a full width at half maximum of less than 0.8°.

9. The method for manufacturing a film structure according to claim 8, wherein
   the step (b1) further comprises a step (b3) of forming a fourth film comprising the first precursor by coating the substrate with the first solution,
   in the step (b1), the step (b3) is repeated a plurality of times to form the third film including a plurality of the fourth films laminated on each other, and
   in the step (c), the second film is formed to further comprise a plurality of crystal grains integrally formed from a lower surface to an upper surface of the second film.

10. The method for manufacturing a film structure according to claim 9, wherein
   each of the plurality of crystal grains has spontaneous polarization,
   the spontaneous polarization includes a polarization component parallel to a thickness direction of the second film, and
   the polarization components included in the spontaneous polarization of each of the plurality of crystal grains are oriented in an identical direction.

11. The method for manufacturing a film structure according to claim 8, wherein
   in the step (a), a silicon substrate is prepared.

12. The method for manufacturing a film structure according to claim 11, further comprising the steps of:
   (d) forming a fifth film comprising zirconium oxide on the silicon substrate, the zirconium oxide having a cubic crystal structure and being (100) oriented; and
   (e) forming a conductive film comprising platinum on the fifth film, the platinum having a cubic crystal structure and being (100) oriented, wherein
   in the step (b), the first film is formed on the conductive film,
   the silicon substrate has a main surface made of a (100) plane, and
   the first composite oxide has a rhombohedral crystal structure and is (100) oriented.

13. The method for manufacturing a film structure according to claim 12, wherein the second composite oxide has a rhombohedral crystal structure and is (100) oriented.

14. The method for manufacturing a film structure according to claim 12, wherein the second composite oxide has a tetragonal crystal structure and is (001) oriented.

* * * * *